United States Patent
Yamazaki et al.

(10) Patent No.: US 7,202,119 B2
(45) Date of Patent: Apr. 10, 2007

(54) METHOD OF MANUFACTURING SEMICONDUCTOR DEVICE

(75) Inventors: Shunpei Yamazaki, Tokyo (JP); Toru Mitsuki, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 252 days.

(21) Appl. No.: 10/914,117

(22) Filed: Aug. 10, 2004

(65) Prior Publication Data

US 2005/0009257 A1 Jan. 13, 2005

Related U.S. Application Data

(62) Division of application No. 10/105,009, filed on Mar. 25, 2002, now Pat. No. 6,812,081.

(30) Foreign Application Priority Data

Mar. 26, 2001 (JP) ............................. 2001-088613

(51) Int. Cl.
*H01L 21/84* (2006.01)
(52) U.S. Cl. .................... 438/151; 438/162; 438/166; 438/473; 438/487
(58) Field of Classification Search ................ 438/149, 438/151, 166, 471, 473
See application file for complete search history.

(56) References Cited

U.S. PATENT DOCUMENTS

| | | | |
|---|---|---|---|
| 3,535,775 A | 10/1970 | Garfinkel et al. | |
| 4,371,403 A | 2/1983 | Ikubo et al. | |
| 4,477,308 A | 10/1984 | Gibson et al. | |
| 4,534,820 A | 8/1985 | Mori et al. | |
| 4,727,044 A | 2/1988 | Yamazaki | |
| 5,244,819 A | 9/1993 | Yue | |
| 5,248,630 A | 9/1993 | Serikawa et al. | |

(Continued)

FOREIGN PATENT DOCUMENTS

JP 05-109737 4/1993

(Continued)

OTHER PUBLICATIONS

U.S. Appl. No. 08/690,747, filed Aug. 1, 1996 as Related Appl.

(Continued)

*Primary Examiner*—M. Wilczewski
*Assistant Examiner*—Toniae M. Thomas
(74) *Attorney, Agent, or Firm*—Nixon Peabody LLP; Jeffrey L. Costellia

(57) ABSTRACT

An orientation ratio of a crystalline semiconductor film obtained by crystallizing an amorphous semiconductor film is increased, a distortion thereof is suppressed, and a TFT using such a crystalline semiconductor film is provided. At the time of formation of the amorphous semiconductor film (102) or after the formation thereof, a noble gas element, typically, argon is included in the film and crystallization is performed therefor. Thus, an orientation ratio of the semiconductor film (104) can be increased and a distortion present in the semiconductor film (104) after the crystallization is suppressed as compared with that present in the semiconductor film before the crystallization. Then, the noble gas element in the film is removed or reduced by laser light irradiation performed later.

16 Claims, 14 Drawing Sheets

U.S. PATENT DOCUMENTS

| | | |
|---|---|---|
| 5,275,896 A | 1/1994 | Garofalo et al. |
| 5,318,661 A | 6/1994 | Kumomi |
| 5,346,833 A | 9/1994 | Wu |
| 5,399,883 A | 3/1995 | Baliga |
| 5,403,772 A | 4/1995 | Zhang et al. |
| 5,426,064 A | 6/1995 | Zhang et al. |
| 5,481,121 A | 1/1996 | Zhang et al. |
| 5,488,000 A | 1/1996 | Zhang et al. |
| 5,492,843 A | 2/1996 | Adachi et al. |
| 5,501,989 A | 3/1996 | Takayama et al. |
| 5,508,533 A | 4/1996 | Takemura |
| 5,529,937 A | 6/1996 | Zhang et al. |
| 5,534,716 A | 7/1996 | Takemura |
| 5,543,352 A | 8/1996 | Ohtani et al. |
| 5,550,070 A | 8/1996 | Funai et al. |
| 5,551,984 A | 9/1996 | Tanahashi |
| 5,563,426 A | 10/1996 | Zhang et al. |
| 5,569,610 A | 10/1996 | Zhang et al. |
| 5,569,936 A | 10/1996 | Zhang et al. |
| 5,580,792 A | 12/1996 | Zhang et al. |
| 5,585,291 A | 12/1996 | Ohtani et al. |
| 5,589,694 A | 12/1996 | Takayama et al. |
| 5,595,923 A | 1/1997 | Zhang et al. |
| 5,595,944 A | 1/1997 | Zhang et al. |
| 5,604,360 A | 2/1997 | Zhang et al. |
| 5,605,846 A | 2/1997 | Ohtani et al. |
| 5,606,179 A | 2/1997 | Yamazaki et al. |
| 5,608,232 A | 3/1997 | Yamazaki et al. |
| 5,612,250 A | 3/1997 | Ohtani et al. |
| 5,614,426 A | 3/1997 | Funada et al. |
| 5,614,733 A | 3/1997 | Zhang et al. |
| 5,616,506 A | 4/1997 | Takemura |
| 5,620,910 A | 4/1997 | Teramoto |
| 5,621,224 A | 4/1997 | Yamazaki et al. |
| 5,624,851 A | 4/1997 | Takayama et al. |
| 5,637,515 A | 6/1997 | Takemura |
| 5,639,698 A | 6/1997 | Yamazaki et al. |
| 5,643,826 A | 7/1997 | Ohtani et al. |
| 5,646,424 A | 7/1997 | Zhang et al. |
| 5,654,203 A | 8/1997 | Ohtani et al. |
| 5,656,825 A | 8/1997 | Kusumoto et al. |
| 5,663,077 A | 9/1997 | Adachi et al. |
| 5,677,549 A | 10/1997 | Takayama et al. |
| 5,696,003 A | 12/1997 | Makita et al. |
| 5,696,386 A | 12/1997 | Yamazaki |
| 5,696,388 A | 12/1997 | Funada et al. |
| 5,700,333 A | 12/1997 | Yamazaki et al. |
| 5,705,829 A | 1/1998 | Miyanaga et al. |
| 5,712,191 A | 1/1998 | Nakajima et al. |
| 5,744,824 A | 4/1998 | Kousai et al. |
| 5,773,327 A | 6/1998 | Yamazaki et al. |
| 5,789,284 A | 8/1998 | Yamazaki et al. |
| 5,814,540 A | 9/1998 | Takemura et al. |
| 5,843,225 A | 12/1998 | Takayama et al. |
| 5,851,860 A | 12/1998 | Makita et al. |
| 5,869,363 A | 2/1999 | Yamazaki et al. |
| 5,888,858 A | 3/1999 | Yamazaki et al. |
| 5,893,730 A | 4/1999 | Yamazaki et al. |
| 5,897,347 A | 4/1999 | Yamazaki et al. |
| 5,915,174 A | 6/1999 | Yamazaki et al. |
| 5,923,962 A | 7/1999 | Ohtani et al. |
| 5,932,893 A | 8/1999 | Miyanaga et al. |
| 5,949,115 A | 9/1999 | Yamazaki et al. |
| 5,956,579 A | 9/1999 | Yamazaki et al. |
| 5,956,581 A | 9/1999 | Yamazaki et al. |
| 5,960,252 A | 9/1999 | Matsuki et al. |
| 5,961,743 A | 10/1999 | Yamazaki et al. |
| 5,962,871 A | 10/1999 | Zhang et al. |
| 5,970,327 A | 10/1999 | Makita et al. |
| 5,977,559 A | 11/1999 | Zhang et al. |
| 5,985,740 A | 11/1999 | Yamazaki et al. |
| 5,997,286 A | 12/1999 | Hemsath et al. |
| 5,998,838 A | 12/1999 | Tanabe et al. |
| 6,013,544 A | 1/2000 | Makita et al. |
| 6,015,593 A | 1/2000 | Yonkoski et al. |
| 6,022,458 A | 2/2000 | Ichikawa |
| 6,027,987 A | 2/2000 | Yamazaki et al. |
| 6,048,758 A | 4/2000 | Yamazaki et al. |
| 6,063,654 A | 5/2000 | Ohtani |
| 6,066,518 A | 5/2000 | Yamazaki |
| 6,071,764 A | 6/2000 | Zhang et al. |
| 6,071,766 A | 6/2000 | Yamazaki et al. |
| 6,072,193 A | 6/2000 | Ohnuma et al. |
| 6,077,731 A | 6/2000 | Yamazaki et al. |
| 6,077,758 A | 6/2000 | Zhang et al. |
| 6,083,324 A | 7/2000 | Henley et al. |
| 6,084,247 A | 7/2000 | Yamazaki et al. |
| 6,087,679 A | 7/2000 | Yamazaki et al. |
| 6,093,934 A | 7/2000 | Yamazaki et al. |
| 6,100,562 A | 8/2000 | Yamazaki et al. |
| 6,111,557 A | 8/2000 | Koyama et al. |
| 6,121,660 A | 9/2000 | Yamazaki et al. |
| 6,133,073 A | 10/2000 | Yamazaki et al. |
| 6,133,075 A | 10/2000 | Yamazaki et al. |
| 6,133,119 A | 10/2000 | Yamazaki |
| 6,153,445 A | 11/2000 | Yamazaki et al. |
| 6,156,590 A | 12/2000 | Yamazaki et al. |
| 6,156,628 A | 12/2000 | Ohnuma et al. |
| 6,160,268 A | 12/2000 | Yamazaki |
| 6,162,667 A | 12/2000 | Funai et al. |
| 6,162,704 A | 12/2000 | Yamazaki et al. |
| 6,165,824 A | 12/2000 | Takano et al. |
| 6,168,980 B1 | 1/2001 | Yamazaki et al. |
| 6,168,981 B1 | 1/2001 | Battaglia et al. |
| 6,180,439 B1 | 1/2001 | Yamazaki et al. |
| 6,184,559 B1 | 2/2001 | Hayakawa et al. |
| 6,194,255 B1 | 2/2001 | Hiroki et al. |
| 6,197,624 B1 | 3/2001 | Yamazaki |
| 6,201,585 B1 | 3/2001 | Takano et al. |
| 6,204,101 B1 | 3/2001 | Yamazaki et al. |
| 6,204,154 B1 | 3/2001 | Zhang et al. |
| 6,207,969 B1 | 3/2001 | Yamazaki |
| 6,218,219 B1 | 4/2001 | Yamazaki et al. |
| 6,225,152 B1 | 5/2001 | Yamazaki et al. |
| 6,232,205 B1 | 5/2001 | Ohtani |
| 6,232,621 B1 | 5/2001 | Yamazaki et al. |
| 6,242,290 B1 | 6/2001 | Nakajima et al. |
| 6,251,712 B1 | 6/2001 | Tanaka et al. |
| 6,255,195 B1 | 7/2001 | Linn et al. |
| 6,285,042 B1 | 9/2001 | Ohtani et al. |
| 6,287,900 B1 | 9/2001 | Yamazaki et al. |
| 6,287,988 B1 | 9/2001 | Nagamine et al. |
| 6,291,275 B1 | 9/2001 | Yamazaki et al. |
| 6,294,441 B1 | 9/2001 | Yamazaki |
| 6,300,659 B1 | 10/2001 | Zhang et al. |
| 6,303,415 B1 | 10/2001 | Yamazaki |
| 6,303,963 B1 | 10/2001 | Ohtani et al. |
| 6,306,694 B1 | 10/2001 | Yamazaki et al. |
| 6,307,214 B1 | 10/2001 | Ohtani et al. |
| 6,316,789 B1 | 11/2001 | Yamazaki et al. |
| 6,316,810 B1 | 11/2001 | Yamazaki et al. |
| 6,331,457 B1 | 12/2001 | Yamazaki et al. |
| 6,337,259 B1 | 1/2002 | Ueda et al. |
| 6,346,730 B1 | 2/2002 | Kitakado et al. |
| 6,362,507 B1 | 3/2002 | Ogawa et al. |
| 6,376,336 B1 | 4/2002 | Buynoski |
| 6,391,690 B2 | 5/2002 | Miyasaka |
| 6,396,147 B1 | 5/2002 | Adachi et al. |
| 6,399,454 B1 | 6/2002 | Yamazaki |
| 6,399,988 B1 | 6/2002 | Yamazaki |
| 6,420,758 B1 | 7/2002 | Nakajima |
| 6,426,276 B1 | 7/2002 | Ohnuma et al. |
| 6,429,097 B1 | 8/2002 | Voutsas et al. |
| 6,436,745 B1 | 8/2002 | Gotou et al. |

| | | |
|---|---|---|
| 6,455,359 B1 | 9/2002 | Yamazaki et al. |
| 6,461,943 B1 | 10/2002 | Yamazaki et al. |
| 6,489,189 B2 | 12/2002 | Yamazaki et al. |
| 6,512,504 B1 | 1/2003 | Yamauchi et al. |
| 6,531,713 B1 | 3/2003 | Yamazaki |
| 6,534,826 B2 | 3/2003 | Yamazaki |
| 6,541,294 B1 | 4/2003 | Yamazaki et al. |
| 6,576,926 B1 | 6/2003 | Yamazaki et al. |
| 6,579,736 B2 | 6/2003 | Yamazaki |
| 6,599,785 B2 | 7/2003 | Hamada et al. |
| 6,599,790 B1 | 7/2003 | Yamazaki et al. |
| 6,680,577 B1 | 1/2004 | Inukai et al. |
| 6,709,902 B2 | 3/2004 | Kitakado et al. |
| 6,737,304 B2 | 5/2004 | Yamazaki et al. |
| 6,743,649 B2 | 6/2004 | Yamazaki et al. |
| 6,808,968 B2 | 10/2004 | Takayama et al. |
| 6,812,081 B2 * | 11/2004 | Yamazaki et al. .......... 438/197 |
| 6,913,956 B2 | 7/2005 | Hamada et al. |
| 7,045,444 B2 | 5/2006 | Yamazaki et al. |
| 7,052,943 B2 | 5/2006 | Yamazaki et al. |
| 2001/0034088 A1 | 10/2001 | Nakamura et al. |
| 2002/0028543 A1 | 3/2002 | Yamazaki et al. |
| 2002/0086469 A1 | 7/2002 | Kim et al. |
| 2002/0094612 A1 | 7/2002 | Nakamura et al. |
| 2002/0098628 A1 | 7/2002 | Hamada et al. |
| 2002/0102764 A1 | 8/2002 | Yamazaki et al. |
| 2002/0102776 A1 | 8/2002 | Yamazaki et al. |
| 2002/0115271 A1 | 8/2002 | Yamazaki et al. |
| 2002/0125480 A1 | 9/2002 | Nakamura et al. |
| 2002/0134981 A1 | 9/2002 | Nakamura et al. |
| 2002/0142554 A1 | 10/2002 | Nakajima |
| 2002/0151120 A1 | 10/2002 | Yamazaki et al. |
| 2002/0151154 A1 | 10/2002 | Yamazaki et al. |
| 2002/0164843 A1 | 11/2002 | Yamazaki et al. |
| 2002/0187594 A1 | 12/2002 | Yamazaki et al. |
| 2002/0197785 A1 | 12/2002 | Yamazaki et al. |
| 2003/0060057 A1 | 3/2003 | Raaijmakers et al. |
| 2003/0062499 A1 | 4/2003 | Yamazaki |
| 2003/0122129 A1 | 7/2003 | Yamazaki et al. |
| 2003/0132900 A1 | 7/2003 | Yamauchi et al. |
| 2003/0197179 A1 | 10/2003 | Yamazaki et al. |
| 2004/0065902 A1 | 4/2004 | Yamazaki et al. |
| 2004/0222425 A1 | 11/2004 | Hamada et al. |
| 2004/0259387 A1 * | 12/2004 | Yamazaki et al. .......... 438/795 |
| 2005/0032336 A1 | 2/2005 | Yamazaki et al. |
| 2005/0227422 A1 | 10/2005 | Nakamura et al. |

FOREIGN PATENT DOCUMENTS

| | | |
|---|---|---|
| JP | 06-151414 | 5/1994 |
| JP | 08-078329 | 3/1996 |
| JP | 09-074207 | 3/1997 |
| JP | 09-115831 | 5/1997 |
| JP | 10-055951 | 2/1998 |
| JP | 2000-105081 | 4/2000 |
| JP | 2001-210828 A | 8/2001 |
| JP | 2001-267264 | 9/2001 |

OTHER PUBLICATIONS

K. S. Jones et al.; "Boron Diffusion upon Annealing of Laser Thermal Processed Silicon," Ion Implantation Technology 2000 (IEEE 2000); pp. 111-114.

L. S. Lee et al.; "Argon Ion-Implantation on Polysilicon or Amorphous-Silicon for Boron Penetration Suppression in p+ pMOSFET," IEEE Transactions on Electron Devices, vol. 45, No. 8, Aug. 1, 1998, pp. 1737-1744.

D. J. Llewellyn et al.; "Implantation and annealing of Cu in InP for electrical isolation: microstructural characterization," IEEE Electron Device Letters, Optoelectronic and Microelectronic Materials and Devices Proceedings, Jan. 1, 1997, pp. 313-316.

M. Miyake et al.; "Characteristics of Buried-Channel $p$MOS Devices with Shallow Counter-Doped Layers Fabricated Using Channel Preamorphization," IEEE Transactions on Electron Devices, vol. 43, No. 3, Mar. 1, 1996, pp. 444-449.

* cited by examiner

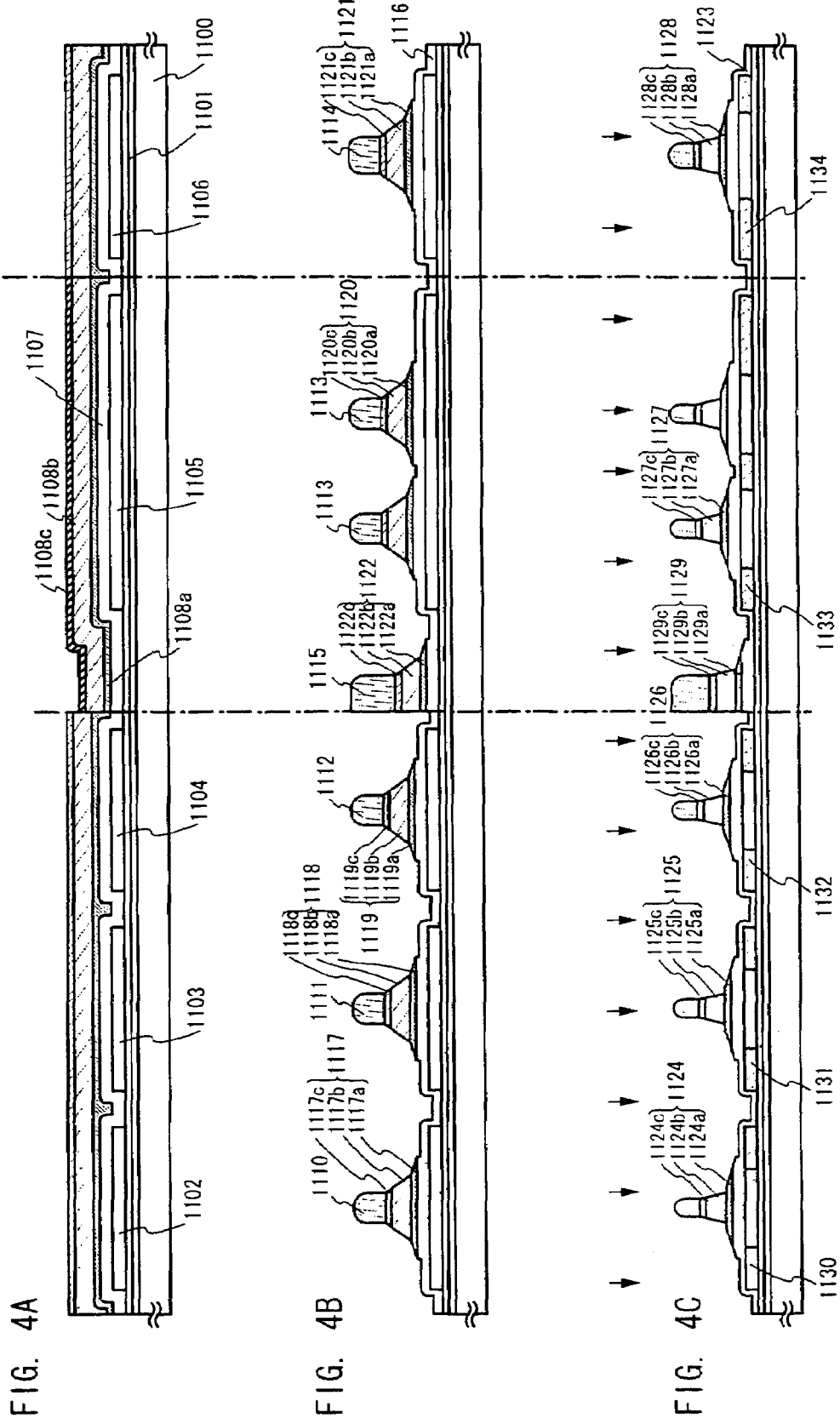

METHOD OF MANUFACTURING SEMICONDUCTOR DEVICE

BACKGROUND OF THE INVENTION

1. Field of the Invention

The present invention relates to a method of manufacturing a semiconductor device having a circuit comprising a thin film transistor (hereinafter referred to as a TFT), for example, an electro-optical device represented by a liquid crystal display panel and an electronic device in which such an electro-optical device is mounted as parts.

Note that in this specification, a semiconductor device indicates a general device functioning by utilizing semiconductor characteristics, that is, an electro-optical device, a semiconductor device, and an electronic device each are a semiconductor device.

2. Description of the Related Art

In recent years, a technique of structuring a thin film transistor (TFT) using a semiconductor thin film (about several to several hundred nm in thickness) formed on a substrate having an insulating surface is drawing attention. The thin film transistor is widely applied to an electronic device such as an IC or an electro-optical device. In particular, the development for a switching element of an image display device is being advanced.

A material of a crystalline semiconductor film suitably used for the TFT is silicon. A silicon film having a crystalline structure (hereinafter referred to as a crystalline silicon film) is generally formed through the following process. That is, an amorphous silicon film is deposited on a substrate made of glass, quartz, or the like by a plasma CVD method or a low pressure CVD method and then crystallized by heating treatment or laser light irradiation (hereinafter referred to as laser processing in this specification) to obtain the crystalline silicon film.

However, in the case of the crystalline silicon film produced by the above conventional method, the crystal orientation planes are present randomly and an orientation ratio with respect to a specific crystal orientation is low. When the orientation ratio is low, it is almost impossible to keep continuity of lattices because of a grain boundary produced by collision of crystals with different orientations. Thus, it can be estimated that a large number of dangling bonds are produced. Dangling bonds which can be produced in the grain boundary become trapping centers of carriers (electron and hole) to reduce transporting characteristics. That is, since the carriers are scattered or trapped, even when a TFT is manufactured using such a crystalline semiconductor film, a TFT having high field effect mobility cannot be expected.

Also, a large number of distortions, defects and the like are present in a silicon film having a crystalline structure, that is, in a polysilicon film. They function as traps of carriers to deteriorate electrical characteristics. Thus, even in the channel forming region of the TFT, an existence configuration of a distortion, a volume of a lattice defect, and the like become large factors for causing a variation in characteristic.

SUMMARY OF THE INVENTION

An object of the present invention is to provide means for solving such problems. That is, an object of the present invention is to increase an orientation ratio of a crystalline semiconductor film obtained by crystallizing an amorphous semiconductor film and to suppress a distortion thereof so that a TFT using such a crystalline semiconductor film is provided.

The present invention is characterized in that at the time of formation of the amorphous semiconductor film or after the formation thereof, a noble gas, typically, argon is included in the semiconductor film and crystallization is performed therefor, and thus an orientation ratio of the film can be increased and a distortion present in the semiconductor film after the crystallization is suppressed as compared with that present in the semiconductor film before the crystallization.

Also, the crystallization of the present invention is characterized in that a metallic element for promoting crystallization of silicon is introduced, a crystalline silicon film is formed by heating treatment at a lower temperature than a conventional one, and a noble gas element is removed or reduced by laser light irradiation performed later.

A distribution of crystal orientation is preferably obtained from an electron backscatter diffraction pattern (EBSP). In the case of the EBSP method, a dedicated purpose detector is provided in a scanning electron microscopy (SEM) and a crystal orientation is analyzed from back scattering of a primary electron. When an electron beam is incident into a sample having a crystalline structure inelastic scattering is also caused in the rear. Of the inelastic scattering, a linear pattern inherent to a crystal orientation due to Bragg diffraction in the sample (generally called a Kikuchi pattern) is also observed. In the case of EBSP, a Kikuchi pattern displayed on the screen of the detector is analyzed to obtain a crystal orientation of the sample. When an orientation analysis is repeated while a position of the sample into which an electron beam is irradiated is shifted (a mapping measurement is performed), information of crystal orientation or alignment can be obtained with respect to a sheet sample. When all crystal orientations of respective crystal grains are obtained by the mapping measurement, a state of crystal orientations in a film can be statistically displayed.

The present inventor(s) et al. performed the following experiment.

(Experiment)

First, a sample in which a base insulating film (silicon oxynitride film: 150 nm in thickness) is formed on a glass substrate and an amorphous silicon film having a thickness of 54 nm is formed thereon by a plasma CVD method is prepared. Next, argon is added to the amorphous silicon film by an ion doping method. An ion doping condition at this time is set such that an accelerating voltage is 30 kV, a dose is $2 \times 10^{15}/cm^2$, and a concentration of argon included in the film is about $3 \times 10^{21}/cm^3$. Next, a solution including nickel at 100 ppm in weight conversion is applied to the amorphous silicon film and then thermal treatment is performed at 500° C. for 1 hour. After that, thermal treatment is performed at 600° C. for 8 hours to crystallize the amorphous silicon film. Thus, a silicon film having a crystalline structure is formed. A distribution of crystal orientation in the thus obtained silicon film having the crystalline structure is examined by an EBSP.

FIG. 14 is an inverse pole figure obtained from the EBSP. The inverse pole figure is often used in the case where a preferred orientation of polycrystal is displayed and collectively indicates which lattice plane is coincided with a specific surface (here, the surface of the film) of the sample. Note that an object having a fan shape in FIG. 14 is generally called a standard triangle and all indexes with respect to a cubic system are included therein. Also, a length in this drawing corresponds to an angle with respect to a crystal orientation. For example, an angle between {001} and {101} is 45 degrees, an angle between {101} and {111} is 35.26 degrees, and an angle between {111} and {001} is 54.74 degrees.

Also, FIG. 14 is obtained by plotting all measurement points by mapping on the standard triangle. Since a density of points becomes high near {101} and {111}, it can be read that a preferred orientation is made for specific indexes (here, {101} and {111}).

Thus, when it is clear that a preferred orientation is made for specific indexes, a ratio as to what degree of crystal grains is gathered near the indexes is digitized and thus the degree of the preferred orientation is easy to image. In the inverse pole figure as shown in FIG. 14, a ratio of the number of points present within an area produced by a deviation angle of 10 degrees from {111} to the whole can be indicated as an orientation ratio.

With respect to the thus obtained orientation ratio, a ratio in the case where an angle produced by a {101} plane detected by a reflection electron diffraction pattern method and the surface of the silicon film is within 10 degrees is 16%, a ratio in the case where an angle produced by a {111} plane and the surface of the semiconductor film is within 10 degrees is 14%, and a ratio in the case where an angle produced by a {001} plane and the surface of the semiconductor film is within 10 degrees is 1%. That is, as compared with the {001} plane, the orientation ratio of crystal becomes higher in the {101} plane and the {111} plane.

Also, information with respect to a distortion is preferably obtained by an X-ray diffraction method. According to the X-ray diffraction method, a diffraction strength is measured while scanning a diffraction angle 2θ. At this time, an interval "d" between lattice planes in the Bragg equation (2d sin θ=λ, where λ is a wavelength of an X-ray) can be obtained from a measurement of 2θ when the strength becomes a peak. Here, when a 2θ scanning is delayed to determine a peak position with precision, information with respect to a distortion applied to a lattice can be also obtained.

According to a structure disclosed in this specification, there is provided a method of manufacturing a semiconductor device, including: a first step of forming a first semiconductor film having an amorphous structure on an insulating surface; a second step of adding a noble gas element to the first semiconductor film having the amorphous structure; a third step of adding a metallic element to the first semiconductor film having the amorphous structure; a fourth step of heating the first semiconductor film and then irradiating laser light thereto for crystallization to form a first semiconductor film having a crystalline structure; a fifth step of forming a barrier layer on a surface of the first semiconductor film having the crystalline structure; a sixth step of forming a second semiconductor film including a noble gas element on the barrier layer; a seventh step of gettering the metallic element to the second semiconductor film to remove or reduce the metallic element in the first semiconductor film having the crystalline structure; and an eighth step of removing the second semiconductor film.

In the above structure, a method of manufacturing a semiconductor device is characterized in that the fifth step of forming the barrier layer is a step of oxidizing the surface of the first semiconductor film having the crystalline structure by laser light irradiation and then oxidizing the surface of the first semiconductor film having the crystalline structure by a solution including ozone.

Also, in the above structure, a method of manufacturing a semiconductor device is characterized in that in the second step, the noble gas element is added to the first semiconductor film having the amorphous structure at a concentration of $1\times10^{17}/cm^3$ or higher, preferably, in a concentration range of $1\times10^{20}/cm^3$ to $3\times10^{20}/cm^3$.

Also, in the above structure, a method of manufacturing a semiconductor device is characterized in that the noble gas element included in the first semiconductor film is removed or reduced by the laser light irradiation in the fourth step.

Also, according to another structure of the present invention, there is provided a method of manufacturing a semiconductor device, including: a first step of forming a first semiconductor film having an amorphous structure on an insulating surface; a second step of adding a noble gas element to the first semiconductor film having the amorphous structure; a third step of adding a metallic element to the first semiconductor film having the amorphous structure; a fourth step of heating the first semiconductor film and then irradiating laser light thereto for crystallization to form a first semiconductor film having a crystalline structure; a fifth step of selectively adding a noble gas element to the first semiconductor film having the crystalline structure to form a region including the noble gas element; a sixth step of gettering the metallic element to the region including the noble gas element to selectively remove or reduce the metallic element in the first semiconductor film having the crystalline structure; and a seventh step of removing the region including the noble gas element.

Also, in the above structure, a method of manufacturing a semiconductor device is characterized in that, in the second step, the noble gas element is added to the first semiconductor film having the amorphous structure at a concentration of $1\times10^{17}/cm^3$ or higher, preferably, in a concentration range of $1\times10^{20}/cm^3$ to $3\times10^{20}/cm^3$.

Also, in the above structure, a method of manufacturing a semiconductor device is characterized in that the noble gas element included in the first semiconductor film is removed or reduced by the laser light irradiation in the fourth step.

Also, in the respective structures described above, a method of manufacturing a semiconductor device is characterized in that the second semiconductor film is formed by a sputtering method using a semiconductor as a target in an atmosphere containing the noble gas element. Also, in the method of manufacturing a semiconductor device, the second semiconductor film is formed by a sputtering method using a semiconductor including one of phosphorus and boron as a target in an atmosphere containing the noble gas element. Also, in the respective structures described above, the second semiconductor film may be formed by a PCVD method in which film formation is performed in the atmosphere containing the noble gas element.

Also, in the respective structures described above, a method of manufacturing a semiconductor device is characterized in that the sixth step is heating treatment or processing for irradiating intense light to the semiconductor film. Also, the sixth step may be processing for performing heating and irradiating intense light to the semiconductor film.

Also, in the respective structures described above, a method of manufacturing a semiconductor device is characterized in that the intense light is light emitted from one selected from the group consisting of a halogen lamp, a metal halide lamp, a xenon arc lamp, a carbon arc lamp, a high pressure sodium lamp, and a high pressure mercury lamp.

Also, in the respective structures described above, it is preferable that in the sixth step, the concentration of the noble gas element contained in the second semiconductor film is higher than that contained in the first semiconductor film having a crystal structure.

Also, after forming a semiconductor film having an amorphous structure, the semiconductor film may be crystallized by using a metal element which promotes crystallization, and according to still another structure of the present invention, a method of manufacturing a semiconductor device is characterized by including: a first step of forming a semiconductor film which includes a noble gas element and has an amorphous structure on an insulating surface; a second step of adding a metallic element to the semiconductor film having the amorphous structure; and a third step of heating the first semiconductor film and then irradiating laser light thereto for crystallization to form a semiconductor film having a crystalline structure.

After forming a semiconductor film having an amorphous structure by allowing the film to include a noble gas element at the time of film formation, the semiconductor film may be crystalized by using elements which promote crystallization and gettering may be made thereto, according to another structure of the present invention, there is provided a method of manufacturing a semiconductor device, including: a first step of forming on an insulating surface a first semiconductor film which includes a noble gas element and has an amorphous structure; a second step of adding a metallic element to the first semiconductor film having the amorphous structure; a third step of heating the first semiconductor film and then irradiating laser light thereto for crystallization to form a first semiconductor film having a crystalline structure; a fourth step of forming a barrier layer on a surface of the first semiconductor film having the crystalline structure; a fifth step of forming a second semiconductor film including a noble gas element on the barrier layer; a sixth step of gettering the metallic element to the second semiconductor film to remove or reduce the metallic element in the first semiconductor film having the crystalline structure; and a seventh step of removing the second semiconductor film.

Also, in the above structure, the second semiconductor film may be formed by a sputtering method using a semiconductor as a target in an atmosphere containing the noble gas element or by a PCVD method in which film formation is performed in the atmosphere containing the noble gas element. Also, the second semiconductor film may be formed by a sputtering method using a semiconductor including one of phosphorus and boron as a target in an atmosphere containing the noble gas element.

Also, in the above structure, it is preferable that, when the second semiconductor film is formed, the concentration of the noble gas element contained in the second semiconductor film is higher than that of the first semiconductor film having the crystalline structure.

Also, in the respective structures described above, a method of manufacturing a semiconductor device is characterized in that the metallic element is at least one selected from the group consisting of Fe, Ni, Co, Ru, Rh, Pd, Os, Ir, Pt, Cu, and Au.

Also, in the respective structures described above, a method of manufacturing a semiconductor device is characterized in that the noble gas element is at least one selected from the group consisting of He, Ne, Ar, Kr, and Xe.

BRIEF DESCRIPTION OF THE DRAWINGS

In the accompanying drawings:

FIGS. 4A to 4C are diagrams showing manufacturing steps of an AM-LCD;

DETAILED DESCRIPTION OF THE PREFERRED EMBODIMENTS

Embodiment modes of the present invention will be described below.

According to the present invention, a method of manufacturing a semiconductor device includes a process of forming an amorphous semiconductor film on an insulating surface, a process of adding a noble gas element to the amorphous semiconductor film, a process of adding a metallic element for promoting crystallization, a process of performing first crystallization by heating treatment, and a process of performing second crystallization by laser light irradiation.

Note that the heating treatment may be thermal treatment using a furnace, processing for irradiating intense light from a lamp light source, or processing for irradiating intense light simultaneous with thermal treatment.

Also, it is desirable that the metallic element is removed or reduced from the semiconductor film having a crystalline structure, which is obtained through the above processes. The thus obtained semiconductor film having the crystalline structure is patterned in a predetermined shape to use it as an active layer of a TFT.

Hereinafter, a manufacturing order of a typical TFT according to the present invention will be simply described using FIGS. 1A to 1C and 2A to 2D.

[Embodiment Mode 1]

Figure 1A:
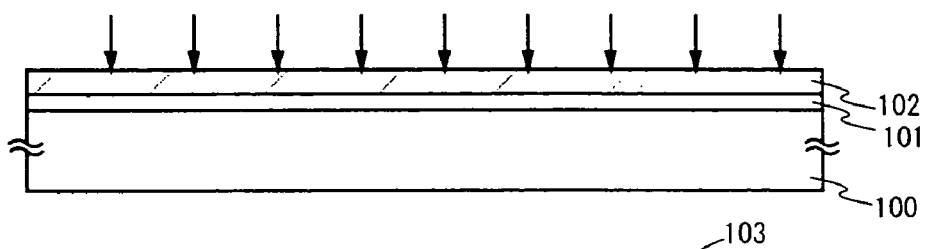
FIGS. 1A to 1C are diagrams showing manufacturing steps representing Embodiment Mode 1.

In FIG. 1A, reference numeral 100 denotes a substrate having an insulating surface, 101 denotes an insulating film serving as a blocking layer, and 102 denotes a semiconductor film having an amorphous structure.

In FIG. 1A, a glass substrate, a quartz substrate, a ceramic substrate or the like can be used as the substrate 100. Also, a silicon substrate, a metallic substrate, or a stainless substrate on the surface of which an insulating film is formed may be used. Further, a plastic substrate having a heat resistance to a processing temperature generated in the steps of this manufacture method.

First, a base insulating film 101 is made of an insulating film such as a silicon oxide film, a silicon nitride film, or a silicon oxynitride film ($SiO_xN_y$) is formed on the substrate 100. As a typical example, the base insulating film 101 comprises a two-layer structure and a structure in which a first silicon oxynitride film to be formed at a thickness of 50 nm to 100 nm using $SiH_4$, $NH_3$, and $N_2O$ as reactive oases and a second silicon oxynitride film to be formed at a thickness of 100 nm to 150 nm using SiH4 and $N_2O$ as reactive oases are laminated. It is preferable that a silicon nitride film (SiN film) having a film thickness of 10 nm or less or the second silicon oxynitride film ($SiO_xN_y$ film (X>>Y)) is used as one layer of the base insulating film 101. In gettering, nickel tends to move to a region having a high oxygen concentration. Thus, it is extremely effective that a silicon nitride film is used as the base insulating film which is in contact with a semiconductor film. Also, a three-layer structure in which the first silicon oxynitride film, the second silicon oxynitride film, and the silicon nitride film are laminated in order may be used.

Next, a first semiconductor film 102 having an amorphous structure is formed on the base insulating film 101. A semiconductor material containing silicon as a main constituent is used for the first semiconductor film. Typically, an amorphous silicon film, an amorphous silicon germanium film, or the like is used as the first semiconductor film and formed at a thickness of 10 nm to 100 nm by a plasma CVD method, a low pressure CVD method, or a sputtering method. In order to obtain a semiconductor film having a high quality crystalline structure by crystallization conducted later, it is preferable that concentrations of impurities such as oxygen and nitrogen which are included in the first semiconductor film having the amorphous structure are reduced to be $5 \times 10^{18}/cm^3$ (atomic concentration measured by a secondary ion mass spectroscopy (SIMS)) or lower. These impurities become a factor for hindering later crystallization and a factor for increasing densities of trapping center and recombination center even after the crystallization. Thus, it is desirable that a high purity material gas is naturally used and a ultra high vacuum support CVD apparatus in which mirror finishing (electropolishing processing) is performed for a reactive chamber and which includes a vacuum evacuation system of oil free is used.

Next, a noble gas element is added to the first semiconductor film 102 by an ion doping method or an ion implantation method (FIG. 1A). One kind or plural kinds of elements selected from the group consisting of helium (He), neon (Ne), argon (Ar), krypton (Kr), and xenon (Xe) are used as noble as elements. Here, an example in the case where these inert gases are used as ion sources and implanted to the semiconductor film by an ion doping method or an ion implantation method is described as an example. In this case, the noble gas element is added to the first semiconductor film such that the concentration becomes $1 \times 10^{17}/cm^3$ or higher, preferably, $1 \times 10^{20}/cm^3$ to $3 \times 10^{20}/cm^3$. The significance of ion implantation of the inert gas is that the ion is implanted between lattices of the first semiconductor film to suppress a distortion. In particular, when an element such as argon (Ar), krypton (Kr), or xenon (Xe), which has a larger atomic radius than that of silicon, the effect of suppressing the distortion is remarkably obtained.

Also, an example in the case where the first semiconductor film 102 is formed and then the noble gas element is added thereto is described here as an example. However, the first semiconductor film may be formed such that the noble gas element is included therein at the film formation. For example, it is preferable that a reactive gas including silane is mixed with an argon gas and the first semiconductor film is formed by a PCVD method. Also, the film formation may be performed in an atmosphere including the noble gas element by a sputtering method to form the fist semiconductor film which includes the noble gas element and has an amorphous structure.

Figure 1B:
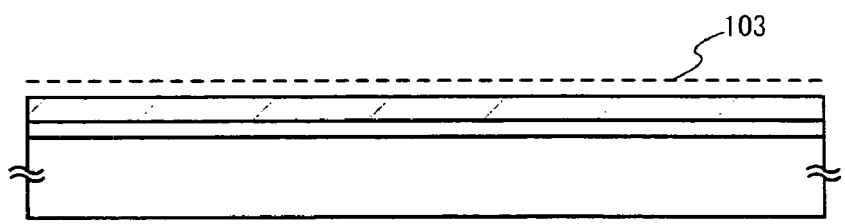

Next, the first semiconductor film 102 having the amorphous structure is crystallized. Here, since the noble gas element is included in the film, the crystallization becomes difficult. Thus, according to the present invention, a metallic element for promoting the crystallization is selectively added thereto and heating treatment is performed to form the semiconductor film having a crystalline structure, which expands from an added region as a staring point. First, a nickel acetate solution including a metallic element (here, nickel) having catalysis for promoting crystallization at 1 ppm to 100 ppm in weight conversion is applied onto the surface of the first semiconductor film 102 which includes the noble gas element and has an amorphous structure by spinner to form a nickel contained layer 103 (FIG. 1B). Means for forming an extremely thin film by a sputtering method, an evaporation method, or plasma processing may be used as another means except the method of forming the nickel contained layer 103 other than the method of application. Although the case where the solution is applied onto the entire surface is described here, however, the nickel contained layer may be selectively formed by forming a mask.

Next, heating treatment is performed for crystallization. (FIG. 1C) Here, thermal treatment for dehydrogenation (at 450° C. to 500° C. for 1 hour) is performed and then thermal treatment for crystallization (at 550° C. to 600° C. for 4 hours to 24 hours) is performed. Also, when crystallization is made by intense light irradiation, infrared light, visible light, ultraviolet light, or a combination thereof can be used. Typically, light emitted from a halogen lamp, a metal halide lamp, a xenon arc lamp, a carbon arc lamp, a high pressure sodium lamp, or a high pressure mercury lamp is used. A lamp light source is turned on for 1 second to 60 seconds, preferably, 30 seconds to 60 seconds. This operation is preferably repeated one time to ten times such that the semiconductor film is instantaneously heated at about 600° C. to 1000° C. Note that if necessary, thermal treatment for releasing hydrogen included in the first semiconductor film 102 having the amorphous structure may be performed before intense light irradiation. Also, the thermal treatment and the intense light irradiation may be simultaneously performed for crystallization. When productivity is considered, it is desirable that the crystallization is made by the intense light irradiation.

Next, in order to increase a crystallization ratio (ratio of a crystal element to a total volume of the film) and to repair a defect left in a crystal grain, laser light is irradiated to a first semiconductor film 104 having a crystalline structure. When the laser light irradiation is performed, a thin oxide film (not shown) is formed on the surface of the first semiconductor film. Also, at that time, the noble gas element in the first semiconductor film is removed or reduced. As the laser light, excimer laser light having a wavelength of 400 nm or less, or the second harmonic or the third harmonic of a YAG laser is used.

An orientation ratio of the first semiconductor film 104 thus obtained is high and a distortion thereof is also suppressed.

Here, a metallic element (here, nickel) is left in the first semiconductor film 104 thus obtained. Although the metallic elements are not uniformly distributed in the film, they are left at a concentration lager than $1\times10^{19}/cm^3$ at an average concentration. Of course, even in such a state, various semiconductor devices including a TFT can be formed. However, the metallic element is removed by the following method.

Figure 2A:
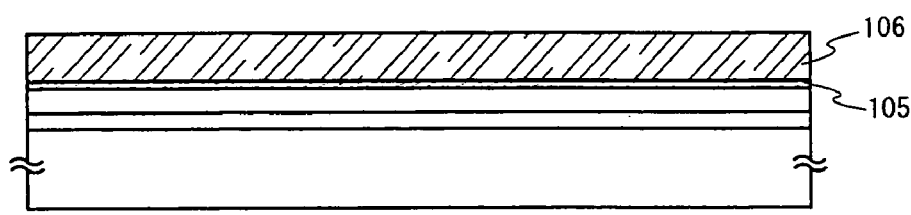
FIGS. 2A to 2D are diagrams showing manufacturing steps of a TFT (Embodiment Mode 1)

Since the oxide film formed by the laser light irradiation after the crystallization is insufficient, another oxide film (called a chemical oxide) is formed by an aqueous solution containing ozone (typically, ozone water) to obtain a barrier layer 105 made of the oxide films having a total thickness of 1 nm to 10 nm. A second semiconductor film 106 including the noble gas element is formed on the barrier layer 105 (FIG. 2A). Note that, it is assumed here that an oxide film formed when laser light is irradiated to the first semiconductor film 104 having the crystalline structure is a portion of the barrier layer 105. The barrier layer 103 functions as an etching stopper in the case where only the second semiconductor film 106 is selectively removed in a later step. Also, even when processing is performed using an aqueous solution in which a hydrogen peroxide solution is mixed with sulfuric acid, hydrochloric acid, nitric acid, or the like instead of the aqueous solution containing ozone, a chemical oxide can be formed as in the above case. According to another method of forming the barrier layer 105, ultraviolet light irradiation may be performed in an oxygen atmosphere to generate ozone and thus the surface of the semiconductor film having the crystalline structure may be oxidized to form the barrier layer. Also, according to still another method of forming the barrier layer 105, an oxide film having a thickness of about 1 nm to 10 nm may be deposited by a plasma CVD method, a sputtering method, an evaporation method, or the like to form the barrier layer. According to a further method of forming the barrier layer 105, a thin oxide film may be formed by heating at about 200° C. to 350° C. using a clean oven. Note that, it is required that the barrier layer 105 formed by any one of the above methods or a combination thereof has a film quality or a film thickness so that nickel in the first semiconductor film can be moved to the second semiconductor film by later gettering.

Here, the second semiconductor film 106 including the noble gas element is formed by a sputtering method, a plasma CVD method, or the like to produce a gettering site. As noble gas elements, one kind or plural kinds of elements selected from the group consisting of helium (He), neon (Ne), argon (Ar), krypton (Kr), and xenon (Xe) are used. Of these, argon (Ar) is preferable since it is an inexpensive gas.

Here, a target made of silicon is used in an atmosphere including the noble gas element to form the second semiconductor film. There are two meanings to include the noble gas element ion as an inert gas in the film. One is to form a dangling bond to cause a distortion in the semiconductor film. The other is to cause a distortion between lattices of the semiconductor film. When an element such as argon (Ar), krypton (Kr), xenon (Xe), or the like, which has a larger atomic radius than that of silicon, a distortion between lattices of the semiconductor film is remarkably produced. Also, when the noble gas element is included in the film, not only a lattice distortion but also a dangling bond is produced to contribute to the improvement of a gettering action. Note that a semiconductor film which includes the noble gas element at a concentration of $1\times10^{19}/cm^3$ to $1\times10^{22}/cm^3$, preferably, $1\times10^{20}/cm^3$ to $1\times10^{21}/cm^3$, more preferably, $5\times10^{20}/cm^3$ and in which the gettering effect is obtained is preferably formed.

Also, when the second semiconductor film is formed using a target including phosphorus as an impurity element having one conductivity type, gettering due to Coulomb force of phosphorus can be made in addition to gettering by the noble gas element.

Also, in gettering, nickel tends to move to a region having a high oxygen concentration. Thus, it is desirable that a concentration of oxygen included in the second semiconductor film 106 is set to a higher concentration than that of oxygen included in the first semiconductor film, for example, $5\times10^{18}/cm^3$ or higher.

Figure 2B:
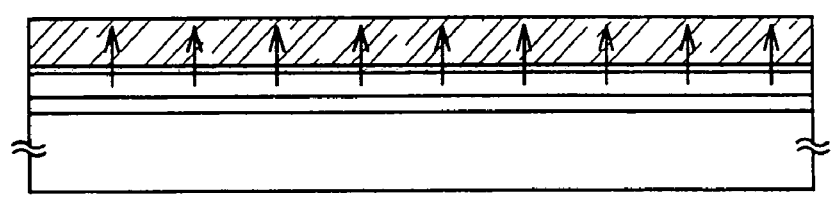

Next, heating treatment is performed for gettering to reduce or remove the metallic element (nickel) in the first semiconductor film (FIG. 2B). Processing for irradiating intense light or thermal treatment is preferably performed as heating treatment for gettering. By the gettering, the metallic element is moved in a direction indicated by an arrow in FIG. 2B (that is, a direction from a substrate side toward the surface of the second semiconductor film). Thus, the metallic element included in the first semiconductor film 104 covered with the barrier layer 105 is removed or the concentration thereof is reduced. It is preferable that a moving distance of the metallic element in gettering is at least a distance corresponding to the thickness of the first semiconductor film. Thus, gettering can be completed in a relatively short time. Here, sufficient gettering is made such that every nickel is moved to the second semiconductor film 106 so as not to segregate it in the first semiconductor film 104 and thus nickel is not almost included in the first semiconductor film 104, that is, such that a nickel concentration in the film is made to be $1\times10^{18}/cm^3$ or lower, desirably, $1\times10^{17}/cm^3$ or lower.

Also, dependent on a condition of heating treatment for the gettering, an increase in a crystallization ratio of the first semiconductor film and repair of a defect left in a crystal grain, that is, the improvement of crystallinity can be made simultaneous with gettering.

Gettering in this specification indicates that a metallic element present in a region to be gettered (here, the first semiconductor region) is released by thermal energy and moved to a gettering site by diffusion. Thus, gettering depends on a processing temperature and is made for a shorter time with increasing a temperature.

When processing for irradiating intense light is used, a lamp light source for heating is turned on for 1 second to 60 seconds, preferably, 30 seconds to 60 seconds. This operation is repeated one time to ten times, preferable two times to six times. A light emission intensity of the lamp light source is arbitrarily set. However, the intensity is set such that the semiconductor film is instantaneously heated at about 600° C. to 1000° C. preferably, about 700° C. to 750° C.

Also, when gettering is made by thermal treatment, thermal treatment is preferably performed in a nitrogen atmosphere at 450° C. to 800° C. for 1 hour to 24 hours, for example, 550° C. for 14 hours. Intense light may be irradiated in addition to the thermal treatment.

Figure 2C:
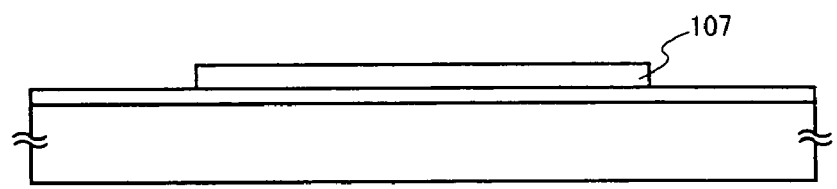

Next, only the second semiconductor film indicated by reference numeral 106 is selectively removed using the barrier layer 105 as an etching stopper. After that, the barrier layer 105 is removed and the first semiconductor film 104 is etched by a known patterning technique to form a semiconductor layer 107 having a predetermined shape (FIG. 2C).

As a method of selectively etching only the second semiconductor film, dry etching without plasma by using $ClF_3$ or wet etching using a alkali solution such as an aqueous solution including hydrazine or tetraethyl ammonium hydroxide (chemical formula $(CH_3)_4NOH$) can be used. Also, when a nickel concentration in the surface of the barrier layer is measured by a TXRF after the second semiconductor film is removed, nickel is detected at a high concentration. Thus, it is preferable that the barrier layer is removed by an etchant including hydrofluoric acid. Also, after removal of the barrier layer, it is desirable that a thin oxide film is formed on the surface using ozone water before a mask made of a resist is formed.

Next, the surface of the semiconductor layer 107 is washed by an etchant including hydrofluoric acid and then an insulating film including silicon as a main constituent is formed as a gate insulating film 108. It is desirable that the surface washing and the formation of the gate insulating film are performed in succession without exposing to air.

Next, the surface of the gate insulating film 108 is washed and then a gate electrode 109 is formed. After that, an impurity element for providing an n-type (P, As, or the like), here, phosphorus is suitably added to the semiconductor to form a source region 110 and a drain region 111. After the addition, heating treatment, intense light irradiation, or laser light irradiation is performed to activate the impurity element. A plasma damage to the gate insulating film and a plasma damage to an interface between the gate insulating film and the semiconductor layer can be recovered simultaneous with the activation. In particular, it is very effective that the second harmonic of a YAG laser is irradiated from the front surface or the rear surface in an atmosphere of a room temperature to 300° C. to activate the impurity element. Since the YAG laser is easy to maintain, it is suitable activation means.

Hereinafter, an interlayer insulating film 113 is formed, hydrogenation is performed, contact holes which reach the source region and drain region are formed, and a source electrode 114 and a drain electrode 115 are formed. Thus, a TFT (n-channel TFT) is completed (FIG. 2D).

A concentration of the metallic element included in a channel forming region 112 in the thus obtained TFT can be set to lower than $1\times10^{17}/cm^3$.

Figure 2D:
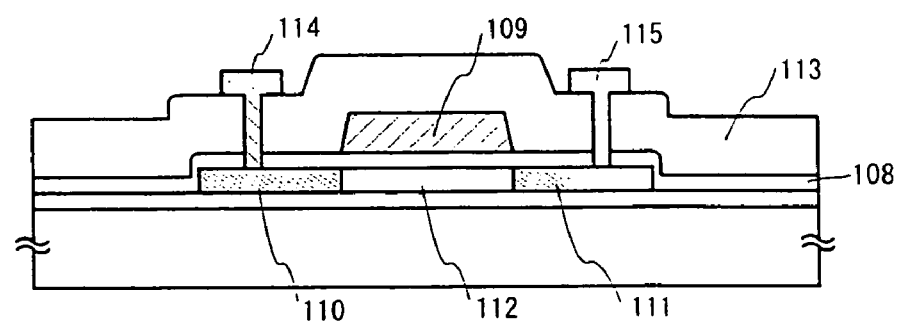

The present invention is not limited to the TFT structure shown in FIG. 2D. If necessary, a low concentration drain (LDD: lightly doped drain) structure in which a LDD region is located between the channel forming region and the drain region (or the source region) may be used. This structure is obtained by providing a region to which an impurity element is added at a low concentration between the channel forming region and the source region or the drain region which each is formed by adding an impurity element thereto at a high concentration. This region is called the LDD region. Further, a so-called GOLD (gate-drain overlapped LDD) structure in which the LDD region is overlapped with the gate electrode through the gate insulating film may be used.

Here, the n-channel TFT is described. However, it is needless to say that a p-channel TFT can be formed by using a p-type impurity element instead of an n-type impurity element.

Also, the example of a top gate TFT is described here. However, the present invention can be applied regardless of a TFT structure. For example, the present invention can be applied to a bottom gate (inverse staggered) TFT or a staggered TFT.

Also, a step order indicated here is merely one example and the present invention is particularly not limited to such a step order. For example, the case where the noble gas element is added to the first semiconductor film and then the metallic element is added thereto is described here. However, the noble gas element may be added to the first semiconductor film after the addition of the metallic element thereto.

[Embodiment Mode 2]

Hereinafter, an example using a gettering method different from that in Embodiment Mode 1 is described. Note that this embodiment mode includes the same steps as in Embodiment Mode 1 and the detail description thereof is omitted here.

Figure 1C:
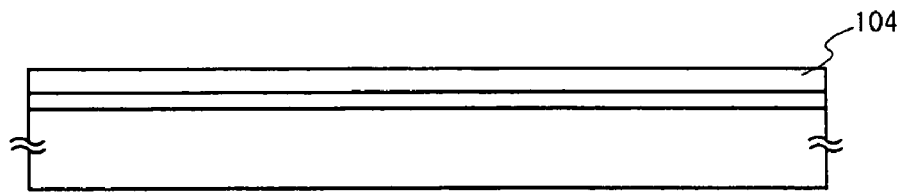

First, the state shown in FIG. 1C is obtained as in Embodiment Mode 1.

Next, a mask is formed and a noble gas element is selectively added. Here, a silicon oxide film having a thickness of 100 nm to 200 nm is formed on the crystalline semiconductor film. A method of forming the silicon oxide film is not limited. For example, tetraethyl orthosilicate (TEOS) is mixed with $O_2$ and discharge is produced at a reactive pressure of 40 Pa, a substrate temperature of 300° C. to 400° C. and a high frequency (13.56 MHz) power density of 0.5 $W/cm^2$ to 0.8 $W/cm^2$ to form the silicon oxide film.

Figure 3A:
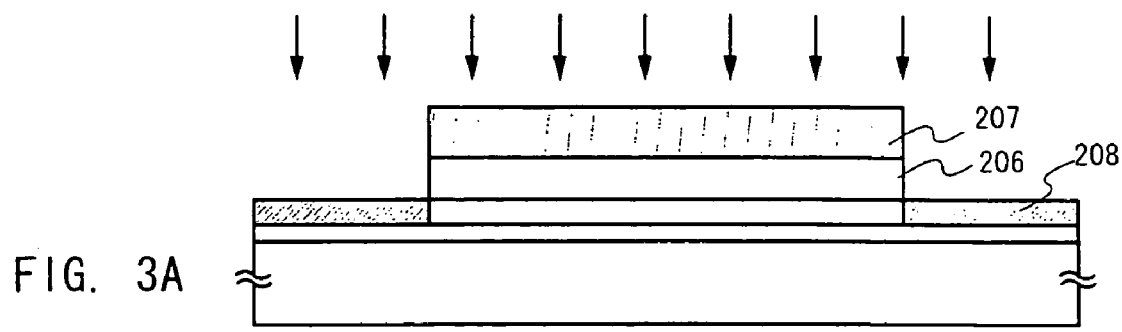
FIGS. 3A to 3D are diagrams showing manufacturing steps of a TFT (Embodiment Mode 2)

Next, a mask 207 made of a resist is formed on the silicon oxide film. Patterning is performed using this mask to form an insulating film 206 made of silicon oxide covering a portion serving as a semiconductor layer of a TFT. After that, a noble gas element is added to the semiconductor film to form gettering sites 208 (FIG. 3A). Here, it is desirable that an ion doping method or an ion implantation method is used and a concentration of the noble gas element added to the semiconductor film is set to be $1\times10^{20}/cm^3$ to $5\times10^{21}/cm^3$. At this time, doping of the noble gas element may be performed with a state that the mask 207 made of the resist is left or doping of the noble gas element may be performed after the mask made of the resist is removed. After the doping of the noble gas element, the mask made of the resist is removed. In addition to the noble gas element, an element belonging to group 15 of the periodic table or an element belonging to group 13 of the periodic table may be added.

Figure 3B:
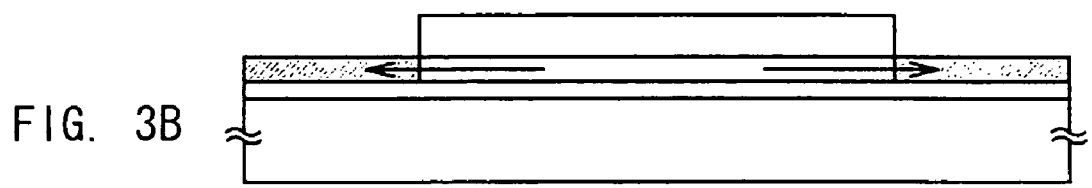

Next, gettering is made (FIG. 3B). For gettering, thermal treatment is performed in a nitrogen atmosphere at 450° C. to 800° C. for 1 hour to 24 hours, for example, 550° C. for 14 hours. Thus, the metallic element can be segregated in the gettering sites 208. By the gettering, the metallic element included in the semiconductor film covered with the insulating film 206 is removed or a concentration thereof is reduced. Intense light may be irradiated instead of the thermal treatment. Also, intense light may be irradiated in addition to the thermal treatment. However, when a RTA method utilizing light emitted from a halogen lamp, a metal halide lamp, a xenon arc lamp, a carbon arc lamp, a high pressure sodium lamp, or a high pressure mercury lamp is used as heating means for gettering, it is desirable that intense light is irradiated such that a heating temperature of the semiconductor film becomes 400° C. to 550° C.

Figure 3C:
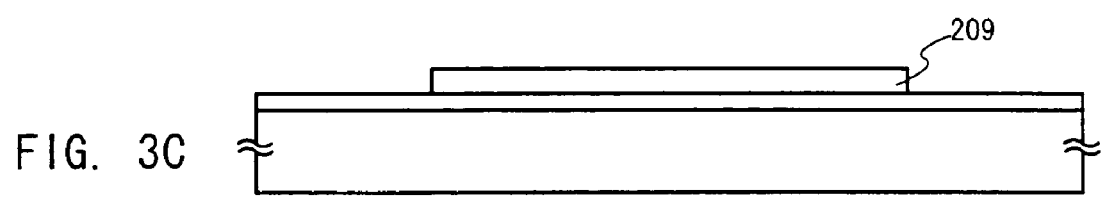

After gettering, the above-mentioned mask is used as it is and the gettering sites are removed to form a semiconductor layer 209 having a predetermined shape, which comprises a region in which the metallic element is reduced. Finally, the insulating layer made of silicon oxide is removed (FIG. 3C). At removal of the insulating layer 206, it is desirable that the surface of the semiconductor layer 209 is slightly etched.

Also, in a stage of forming the mask made of the resist, doping of the noble gas element through the silicon oxide film may be performed to form the gettering sites. In this case, the mask is removed after doping, gettering is made, and then the silicon oxide film is removed. After that, only regions of the semiconductor film, to which the noble gas element is added (gettering sites) are selectively removed to form the semiconductor layer. When a dash solution, a Sirtle solution, a Secco solution, or the like is used as an etchant, since the region to which the noble gas element is added is made to be amorphous, this region can be selectively etched from the region serving as the crystalline silicon film (to which the noble gas element is not added).

Figure 3D:
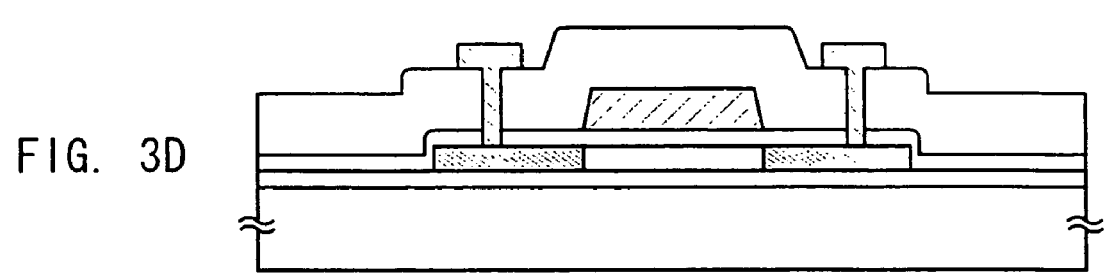

The following steps are the same steps as in Embodiment Mode 1 to complete is a TFT. (FIG. 3D)

This embodiment mode can be combined with Embodiment Mode 1. Also, this embodiment mode can be combined with another known gettering technique.

The present invention made by the above structure will be described more detail through embodiments indicated below.

[Embodiment 1]

An embodiment of the present invention will be described with reference to FIGS. 4 to 6. Here a detailed description is given on a method of simultaneously forming on the same substrate a pixel portion and TFTs (an n-channel TFT and a p-channel TFT) for driving circuits that are placed in the periphery of the pixel portion.

First, abase insulating film 1101 is formed on a glass substrate 1100 and a first semiconductor film having a crystal structure is formed in the manner described in Embodiment Mode. Then the semiconductor film is etched into desired shapes to form semiconductor layers 1102 to 1106 that are separated from one another like islands.

For detailed explanation on the process up through formation of the semiconductor layers 1102 to 1106, see Embodiment Mode 1. What follows is an abbreviated version thereof.

The base insulating film 1101 formed on the glass substrate in this embodiment has a two-layer structure. However, the base insulating film may be a single layer or three or more layers of insulating films. The first layer of the base insulating film 1101 is a first silicon oxynitride film (composition ratio: Si=32%, O=27%, N=24%, H=17%) formed to a thickness of 50 nm by plasma CVD using as reaction Pas $SiH_4$, $NH_3$, and $N_2O$. The second layer of the base insulating film 1101 is a second silicon oxynitride film (composition ratio: Si=32%, O=59%, N=7%, H=2%) formed to a thickness of 100 nm by plasma CVD using as reaction gas $SiH_4$ and NO.

Next, an amorphous silicon film is formed on the base insulating film 1101 to a thickness of 50 nm by plasma CVD. Then a nickel acetate solution containing 10 ppm of nickel by weight is applied by a spinner to the semiconductor film. Instead of application, sputtering may be used to spray nickel elements to the entire surface.

Next, noble gas (argon, in this embodiment) is added to the amorphous silicon film by an ion doping method. The noble gas is added to the amorphous silicon film in the concentration at least $1 \times 10^{17}/cm^3$ or preferably added in the concentration from $1 \times 10^{20}/cm^3$ to $3 \times 10^{20}/cm^3$. By containing argon before the crystallization, a film orientation ratio is raised, and distortion in the film is relieved after the crystallization.

A multi-task type lamp annealing apparatus with 21 tungsten halogen lamps in total is used for irradiation of intense light at 700° C. for 110 seconds to obtain a silicon film having a crystal structure. Heating by the lamp annealing apparatus at 700° C. or lower heats the semiconductor film instantly but the substrate 1100 is hardly deformed. Though a lamp annealing apparatus is used in this embodiment for the crystallization, thermal treatment using a furnace can also be used for the crystallization.

Next, the semiconductor film is irradiated with laser light (XeCl: wavelength, 308 nm) to raise the crystallization ratio and repair defects remaining in the crystal grains. The laser light used is excimer laser light having a wavelength of 400 nm or less, or second harmonic or third harmonic of YAG laser. In either case, pulse laser light with a repetition frequency of about 10 to 1000 Hz is collected by an optical system into a beam of 100 to 400 $mJ/cm^2$, and the beam irradiates the surface of the silicon film by scanning it at an overlap ratio of 90 to 95%. Laser light irradiation at this point is very important because it is used to relieve or decrease a noble gas element (argon, in this embodiment) including the film. The oxide film formed by this laser light irradiation and an oxide film formed by treating the surface with ozone water for 120 seconds together make a barrier layer that has a thickness of 1 to 5 nm in total.

On the barrier layer, an amorphous silicon film containing argon elements is formed to a thickness of 150 nm by sputtering to serve as a gettering site. Film formation conditions by sputtering in this embodiment include setting the film formation pressure to 0.3 Pa, the gas (Ar) flow rate to 50 sccm, the film formation power to 3 kW, and the substrate temperature to 150° C. The amorphous silicon film that is formed under the above conditions contains argon elements in an atomic concentration of $3 \times 10^{20}$ to $6 \times 10^{20}/cm^3$, and contains oxygen in an atomic concentration of $1 \times 10^{19}$ to $3 \times 10^{19}/cm^3$. Thereafter, a lamp annealing apparatus is used in heat treatment at 650° C. for 3 minutes for gettering.

With the barrier layer as an etching stopper, the amorphous silicon film containing argon elements, which is a gettering site, is selectively removed. The barrier layer is then selectively removed using diluted fluoric acid. It is desirable to remove the barrier layer that comprises oxide films after gettering since nickel tends to move into a region of high oxygen concentration during gettering.

Next, a thin oxide film is formed from ozone water on the surface of the obtained silicon film having a crystal structure (also called a polysilicon film). A resist mask is formed for etching to obtain semiconductor layers having desired shapes and separated from one another like islands. After the semiconductor layers are obtained, the resist mask is removed.

In addition, after forming a semiconductor layer, in order to control the threshold (Vth) of the TFTs, the semiconductor layers may be doped with an impurity element that gives the p-type or n-type conductivity. Impurity elements known to give a semiconductor the p-type conductivity are Group 13 elements in the periodic table, such as boron (B), aluminum (Al), and gallium (Ga). Imput elements known to give a semiconductor the n-type conductivity are Group 15 elements in the periodic table, such as phosphorus (P) and arsenic (As).

An etchant containing fluoric acid is used to remove the oxide film and wash the surface of the silicon film at the same time. Then an insulating film mainly containing silicon is formed to serve as a gate insulating film 1107. The gate insulating film in this embodiment is a silicon oxynitride film (composition ratio: Si=32%, O=59%, N=7%, H=2%) formed by plasma CVD to a thickness of 115 nm.

As shown in FIG. 4A, a first conductive film 1108a with a thickness of 20 to 100 nm, a second conductive film 1108b with a thickness of 100 to 400 nm, and a third conductive film 1108c with a thickness of 20 to 100 nm are layered on the gate insulating film 1107. In this embodiment, a 50 nm thick tungsten film, a 500 nm thick Al—Ti (alloy of aluminum and titanium) film, and a 30 nm thick titanium film are layered on the gate insulating film 1107 in the order stated.

Conductive materials for forming the first to third conductive films are elements selected from the group consisting of Ta, W, Ti, Mo, Al, and Cu, or alloy or compound materials mainly containing the elements above. Alternatively, the first to third conductive films may be polycrystalline silicon films or other semiconductor films doped with an impurity element such as phosphorus. For instance, the first conductive film may be a tungsten nitride film instead of the tungsten film, the second conductive film may be an Al—Si (alloy of aluminum and silicon) film instead of the Al—Ti (alloy of aluminum and titanium) film, and the third conductive film may be a titanium nitride film instead of the titanium film. It is not always necessarily be three layers of conductive films but two layers of conductive films, a tantalum nitride film and a tungsten film, for example, may be employed.

As shown in FIG. 4B, resist masks 1110 to 1115 are formed by light exposure to conduct the first etching treatment for forming gate electrodes and wiring lines. The first etching treatment is conducted under first and second etching conditions. ICP (inductively coupled plasma) etching is employed. The films can be etched into desired taper shapes by using ICP etching and adjusting etching conditions (the amount of power applied to a coiled electrode, the amount of power applied to a substrate side electrode, the temperature of the substrate side electrode, etc.) suitably. Examples of the etching gas used include chlorine-based gas, typically, $Cl_2$, $BCl_3$, $SiCl_4$ or $CCl_4$, fluorine-based gas, typically, $CF_4$, $SF_6$, or $NF_3$, and $O_2$.

No limitation is put on selection of etching gas but $BCl_3$, $Cl_3$, and $O_2$ are suitable here. The gas flow rate thereof is set to 65:10:5 (unit:sccm), and an RF (13.56 MHz) power of 450 W is given to a coiled electrode at a pressure of 1.2 Pa to generate plasma for 117 second etching. The substrate side (sample stage) also receives an RF (13.56 MHz) power of 300 W to apply substantially negative self-bias voltage. Under the first etching conditions, the Al film and the Ti film are etched to taper first conductive layers around the edges.

Switching to the second etching conditions, the etching gas is changed to $CF_4$, $Cl_2$, and $O_2$. The gas flow rate thereof is set to 25:25:10 (unit:sccm), and an RF (13.56 MHz) power of 500 W is given to a coiled electrode at a pressure of 1 Pa to generate plasma, performing the etching for about 30 seconds. The substrate side (sample stage) also receives an RF (13.56 MHz) power of 20 W to apply substantially negative self-bias voltage. Under the second etching conditions using a mixture gas of $CF_4$ and $Cl_2$, the Al film, the Ti film, and the W film are etched to about the same degree. In order to etch the films without leaving any residue on the gate insulating film, the etching time is prolonged by approximately 10 to 20%.

In the first etching treatment, the first conductive layers, second conductive layers, and third conductive layers are tapered around the edges by forming the resist masks into proper shapes and by the effect of the bias voltage applied to the substrate. The angle of the tapered portions is 15 to 45°. First shape conductive layers 1117 to 1122 are thus formed from the first conductive layers, the second conductive layers, and the third conductive layers through the first etching treatment (the first conductive layers 1117a to 1122a, the second conductive layers 1117b to 1112b and the third conductive layers 1117c to 1122c). Denoted by, 1116 is a gate insulating film and regions thereof that are not covered with the first shape conductive layers 1117 to 1122 are etched and thinned by about 20 to 50 nm.

Without removing the resist masks 1110 to 1115, second etching treatment is conducted next as shown in FIG. 4C. $BCl_3$ and $Cl_2$ are used as etching gas, the gas flow rate thereof is set to 20:60 (unit:sccm), and an RF (13.56 MHz) power of 600 W is given to a coiled electrode at a pressure of 1.2 Pa to generate plasma for the etching. The substrate side (sample stage) also receives an RF (13.56 MHz) power of 100 W. Under these third etching conditions, the second conductive layers and the third conductive layers are etched. The aluminum film containing a minute amount of titanium and the titanium film are thus subjected to anisotropic etching under the third etching conditions to form second shape conductive layers 1124 to 1129 (the first conductive layers 1124a to 1129a, the second conductive layers 1124b to 1129b and the third conductive layers 1124c to 1129c). Denoted by 1123 is a gate insulating film and regions thereof are formed that are not covered with the second shape conductive layers 1124 to 1129 etched and thinned slightly.

Without removing the resist masks, the first doping treatment is conducted to dope the semiconductor layers with an impurity element that gives the n-type conductivity. The doping treatment employs ion doping or ion implantation. In ion doping, the dose is set to $1.5 \times 10^{14}$ atoms/cm$^2$ and the acceleration voltage is set to 60 to 100 keV. Typically, phosphorus (P) or arsenic (As) is used as an impurity element that gives the n-type conductivity. In this case, the second shape conductive layers 1124 to 1128 serve as masks against the impurity element that gives the n-type conductivity and first impurity regions 1130 to 1134 are formed in a self-aligning manner. The first impurity regions 1130 to 1134 are each doped with the impurity element that gives the n-type conductivity in a concentration of $1 \times 10^{16}$ to $1 \times 10^{17}$/cm$^3$.

Although the first doping treatment is conducted without removing the resist masks in this embodiment, the resist mask may be removed before the first doping treatment.

Figure 5A:
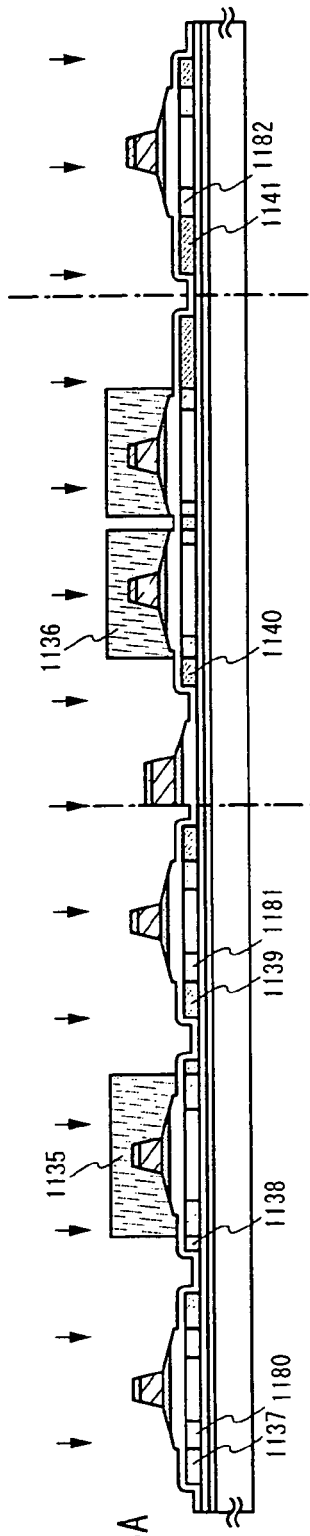
FIGS. 5A to 5C are diagrams showing manufacturing steps of the AM-LCD.

After the resist masks are removed, resist masks 1135 and 1136 are formed as shown in FIG. 5A for second doping treatment. The mask 1135 is for protecting a channel formation region and its surrounding regions in the semiconductor layer that forms one of n-channel TFTs of the driving circuit. The mask 1136 is for protecting a channel formation region and its surrounding regions in the semiconductor layer that forms a TFT of the pixel portion.

The second doping treatment employs ion doping to dope the semiconductor layers with phosphorus (P) setting the dose to $1.5 \times 10^{15}$ atoms/cm$^2$ and the acceleration voltage to 60 to 100 keV. Here, impurity regions are formed in the semiconductor layers utilizing the difference in thickness of the second shape conductive layers 1124 to 1128 and the gate insulating film 1123. The regions covered with the masks 1135 and 1136 are not doped with phosphorus (P). Second impurity regions 1180 to 1182 and third impurity regions 1137 to 1141 are thus formed. The third impurity regions 1137 to 1141 are doped with an impurity element that gives the n-type conductivity in a concentration of $1 \times 10^{20}$ to $1 \times 10^{21}$ cm$^3$. The second impurity regions are doped with the impurity element that gives the n-type conductivity in a concentration lower than in the third impurity regions due to the difference in thickness of the gate insulating film. The concentration of the impurity element in the second impurity regions is $1 \times 10^{18}$ to $1 \times 10^{19}$/cm$^3$.

Figure 5B:
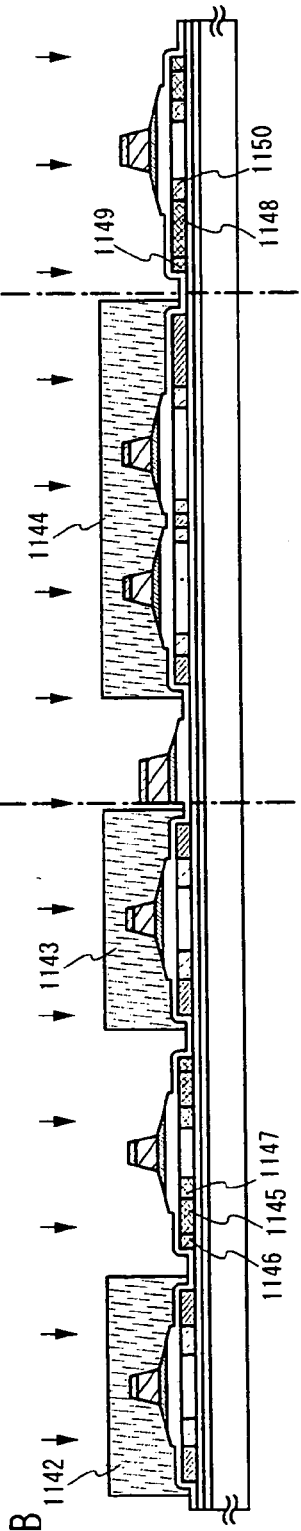
Figure 5C:
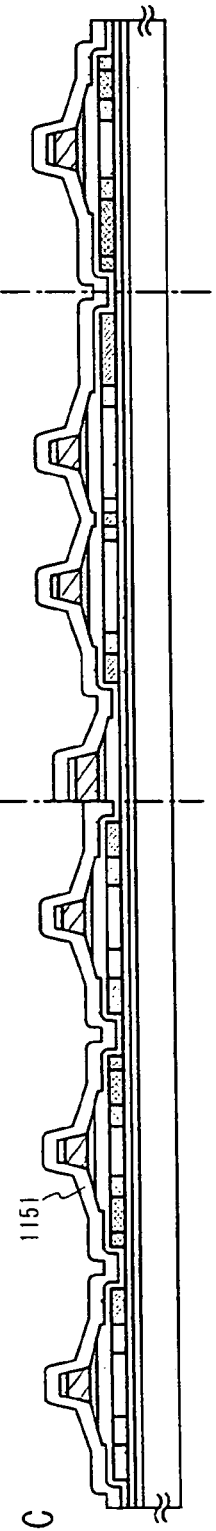

After the resist masks 1135 and 1136 are removed, resist masks 1142 to 1144 are newly formed as shown in FIG. 5B for the third doping treatment. Through the third doping treatment, a fourth impurity region 1147 and fifth impurity regions 1145 and 1146 are formed in the semiconductor layer for forming the p-channel TFT. The fourth and fifth impurity regions are doped with an impurity element that gives the p-type conductivity. The fourth impurity region is formed in a region that overlaps one of the second shape conductive layers and is doped with an impurity element that gives the p-type conductivity in a concentration of $1 \times 10^{18}$ to $1 \times 10^{20}/cm^3$. The fifth impurity regions 1145 and 1146 are doped with an impurity element that gives the p-type conductivity in a concentration of $1 \times 10^{20}$ to $1 \times 10^{21}/cm^3$. The fifth impurity region 1146 is doped with phosphorus (P) in the previous step. However, through the third doping treatment, the region 1146 is doped with an impurity element that gives the p-type conductivity in a concentration 1.5 to 3 times higher than the phosphorus concentration and therefore has the p-type conductivity.

Fifth impurity regions 1148 and 1149 and a fourth impurity region 1150 are formed in the semiconductor layer for forming a storage capacitor in a pixel portion.

Through the above steps, the impurity regions having the n-type or p-type conductivity are formed in the semiconductor layers. The second shape conductive layers 1124 to 1127 serve as gate electrodes. The second shape conductive layer 1128 serves as one of electrodes constituting the storage capacitor in the pixel portion. The second shape conductive layer 1129 forms a source wiring line in the pixel portion.

Next, an insulating film (not shown) is formed to cover the surface almost completely. The insulating film in this embodiment is a silicon oxynitride film formed by plasma CVD to a thickness of 50 nm. The insulating film is not limited to the silicon oxide film and a single layer or a laminate of other insulating films that contains silicon may be used instead.

The next step is activation of the impurity elements added to the semiconductor layers respectively. The activation step is achieved by rapid thermal annealing (RTA) using a lamp light source, back side irradiation with a YAG laser or an excimer laser, or heat treatment using a furnace, or a combination of these methods. Since a material mainly containing aluminum is used in the second conductive layers in this embodiment, heating conditions in the activation step has to be set taking into consideration the heat resistance of the second conductive layers.

During the activation treatment, gettering is simultaneously achieved in the third impurity regions 1137, 1139, and 1140 and the fifth impurity regions 1146 and 1149 that contain high concentration of phosphorus. Through the gettering, nickel used as a catalyst in crystallization is moved into these high phosphorus concentration regions and the nickel concentration is reduced in the semiconductor layers for mainly forming channel formation regions. The channel formation regions with reduced nickel concentration lower the OFF current value and improve the crystallinity in TFTs, and therefore provide high field effect mobility and excellent characteristics. In this embodiment, gettering has already been conducted once in accordance with the method shown in Embodiment Mode 1 when the semiconductor layers are formed, making this gettering with phosphorus the second time gettering. If the first time gettering is through, the second time gettering is not particularly necessary.

Although the insulating film is formed before the activation in the example shown in this embodiment, the insulating film may be formed after the activation.

Next, a silicon nitride film is formed as a first interlayer insulating film 1151 and heat treatment (at 300 to 550° C. for 1 to 12 hours) is performed on the first interlayer insulating film to hydrogenate the semiconductor layers. (FIG. 5C) This step is for terminating dangling bonds in the semiconductor layers using hydrogen contained in the first interlayer insulating film 1151. Irrespective of the presence or absence of the insulating film that is a silicon oxide film (not shown), the semiconductor layers can be hydrogenated. However, heating conditions in the hydrogenation step has to be set taking into consideration the heat resistance of the second conductive layers since a material mainly containing aluminum is used in the second conductive layers in this embodiment. Other hydrogenation measures employable include plasma hydrogenation (which uses hydrogen excited by plasma).

On the first interlayer insulating film 1151, a second interlayer insulating film 1152 is formed from an organic insulating material. (FIG. 6) In this embodiment, an acrylic resin film with a thickness of 1.6 mm is used. A contact hole reaching the source wiring line 1127 and contact holes reaching other impurity regions are formed next. In this embodiment, a plurality of etching processes are sequentially conducted. In this embodiment, the contact holes are formed by etching the second interlayer insulating film with the first interlayer insulating film as an etching stopper, then etching the first interlayer insulating film with the insulating film (not shown) as an etching stopper, and then etching the insulating film (not shown).

Thereafter, wiring lines and a pixel electrode are formed from Al, Ti, Mo, W, or the like. Materials for the electrodes and pixel electrode are, desirably, a film mainly containing Al or Ag, or highly reflective materials such as a laminate of a film mainly containing Al and a film mainly containing Ag. Thus formed are source or drain wiring lines 1153 to 1158, a gate wiring line 1160, a connection wiring line 1159, and a pixel electrode 1161.

A driving circuit 406 that has an n-channel TFT 401, a p-channel TFT 402, and an n-channel TFT 403 and a pixel portion 407 that has an n-channel TFT 404 and a storage capacitor 405 are formed on the same substrate by the method described above. (FIG. 6) Such a substrate is called in this specification as an active matrix substrate for conveniences' sake.

The n-channel TFT 401 (second n-channel TFT) of the driving circuit 406 has a channel formation region 1162, a second impurity region 1163 partially overlapping the second shape conductive layer 1124 that serves as a gate electrode, and a third impurity region 1164 that functions as a source region or a drain region. The p-channel TFT 402 has a channel formation region 1165, a fourth impurity region 1166 partially overlapping the second shape conductive layer 1125 that serves as a gate electrode, and a fourth impurity region 1167 that functions as a source region or a drain region. The n-channel TFT 403 (second n-channel TFT) has a channel formation region 1168, a second impurity region 1169 partially overlapping the second shape conductive layer 1126 that serves as a gate electrode, and a third impurity region 1170 that functions as a source region or a drain region. The n-channel TFTs and the p-channel TFT can be used to form a shift register circuit, a buffer circuit, a level shifter circuit, a latch circuit, and the like. The structure of the n-channel TFT 401 or 403 is suitable especially for a buffer circuit that is high in driving voltage because the stricture can prevent degradation by hot carrier effect.

The pixel TFT 404 (first n-channel TFT) of the pixel portion 407 has a channel formation region 1171, a first impurity region 1172 formed outside of the second shape conductive layer 1128 that serves as a gate electrode, and a third impurity region 1173 that functions as a source region or a drain region. A fourth impurity region 1176 and a fifth impurity region 1177 are formed in the semiconductor layer that functions as one of the electrodes of the storage capacitor 405. The storage capacitor 405 comprises the second shape electrode 1129 and the semiconductor layer 1106 with an insulating film (the same film as the gate insulating film) as dielectric.

If the pixel electrode is formed from a transparent conductive film using one more photo mask, a transmissive display device is obtained.

[Embodiment 2]

The gate electrodes have a three-layer structure in the example shown in Embodiment 1. In this embodiment, gate electrodes have a two-layer structure. This embodiment is identical with Embodiment 1 except the gate electrodes. Accordingly, only the difference is described.

In this embodiment, a TaN film with a thickness of 30 nm is formed as a first conductive film and a W film with a thickness of 370 nm is layered thereon as a second conductive film. The TaN film is formed by sputtering using a Ta target in an atmosphere containing nitrogen. The W films are formed by sputtering using a W target. An alloy film consisted of W and Mo can be used substituted for W film.

As in Embodiment 1, this embodiment employs ICP etching and etches the films into desired taper shapes by adjusting etching conditions (the amount of power applied to a coiled electrode, the amount of power applied to a substrate side electrode, the temperature of the substrate side electrode, etc.) suitably. Examples of the etching gas used include chlorine-based gas, typically, $Cl_2$, $BCl_3$, $SiCl_4$, or $CCl_4$, fluorine-based gas, typically, $CF_4$, $SF_6$, or $NF_3$, and $O_2$.

Similar to Embodiment 1, the first etching treatment in this embodiment uses first and second etching conditions. The first etching conditions include using as etching gas $CF_4$, $Cl_2$, and $O_2$, setting the gas flow rate thereof to 25:25:10 (unit:sccm), and giving an RF (13.56 MHz) power of 500 W to a coiled electrode at a pressure of 1 Pa to generate plasma for the etching. The substrate side (sample stage) also receives an RF (13.56 MHz) power of 150 W to apply substantially negative self-bias voltage. Under the first etching conditions, the rate of etching the W film is 200.39 nm/min. and the rate of etching the TaN film is 80.32 nm/min. The selective ratio of W to TaN is therefore about 2.5. The W film is tapered under the first etching conditions at an angle of about 26°.

Thereafter the etching conditions are switched to second etching conditions without removing the resist masks. The etching gas is changed to $CF_4$ and $Cl_2$. The gas flow rate thereof is set to 30:30 (unit:sccm), and an RF (13.56 MHz) power of 500 W is given to a coiled electrode at a pressure of 1 Pa to generate plasma, performing the etching for about 30 seconds. The substrate side (sample stage) also receives an RF (13.56 MHz) power of 20 W to apply substantially negative self-bias voltage. Under the second etching conditions including the use of a mixture of $CF_4$ and $Cl_2$, the TaN film and the W film are etched to about the same degree. The rate of etching the W film is 58.97 nm/min. and the rate of etching the TaN film is 66.43 nm/min. under the second etching conditions.

In the first etching treatment, first conductive layers and second conductive layers are tapered around the edges by forming the resist masks into proper shapes and by the effect of the bias voltage applied to the substrate side. The angle of the tapered portions may be 15 to 45°.

The second etching treatment is conducted as in Embodiment 1. Here, $SF_6$, $Cl_2$, and $O_2$ are used as etching gas, the gas flow rate thereof is set to 24:12:24 (unit:sccm), and an RF (13.56 MHz) power of 700 W is given to a coiled electrode at a pressure of 1.3 Pa to generate plasma for 25 second etching. The substrate side (sample stage) also receives an RF (13.56 MHz) power of 10 W to apply substantially negative self-bias voltage. In the second etching treatment, the rate of etching the W film is 227.3 nm/min. and the rate of etching the TaN film is 32.1 nm/min. The selective ratio of W to TaN is therefore 7.1. The rate of etching the silicon oxynitride film (SiON) that serves as the gate insulating film is 33.7 nm/min. The W film is tapered in the second etching treatment at an angle of 700.

Compared to Embodiment 1, the gate electrodes in this embodiment are higher in electric resistance because of being formed from a laminate of a W film and a TaN film but have higher heat resistance. Therefore the gate electrodes in this embodiment have advantages of not being influenced by activation or hydrogenation conditions.

[Embodiment 3]

This embodiment describes a process of manufacturing an active matrix liquid crystal display device from the active matrix substrate fabricated in Embodiment 1. The description is given with reference to FIG. 7.

Figure 6:
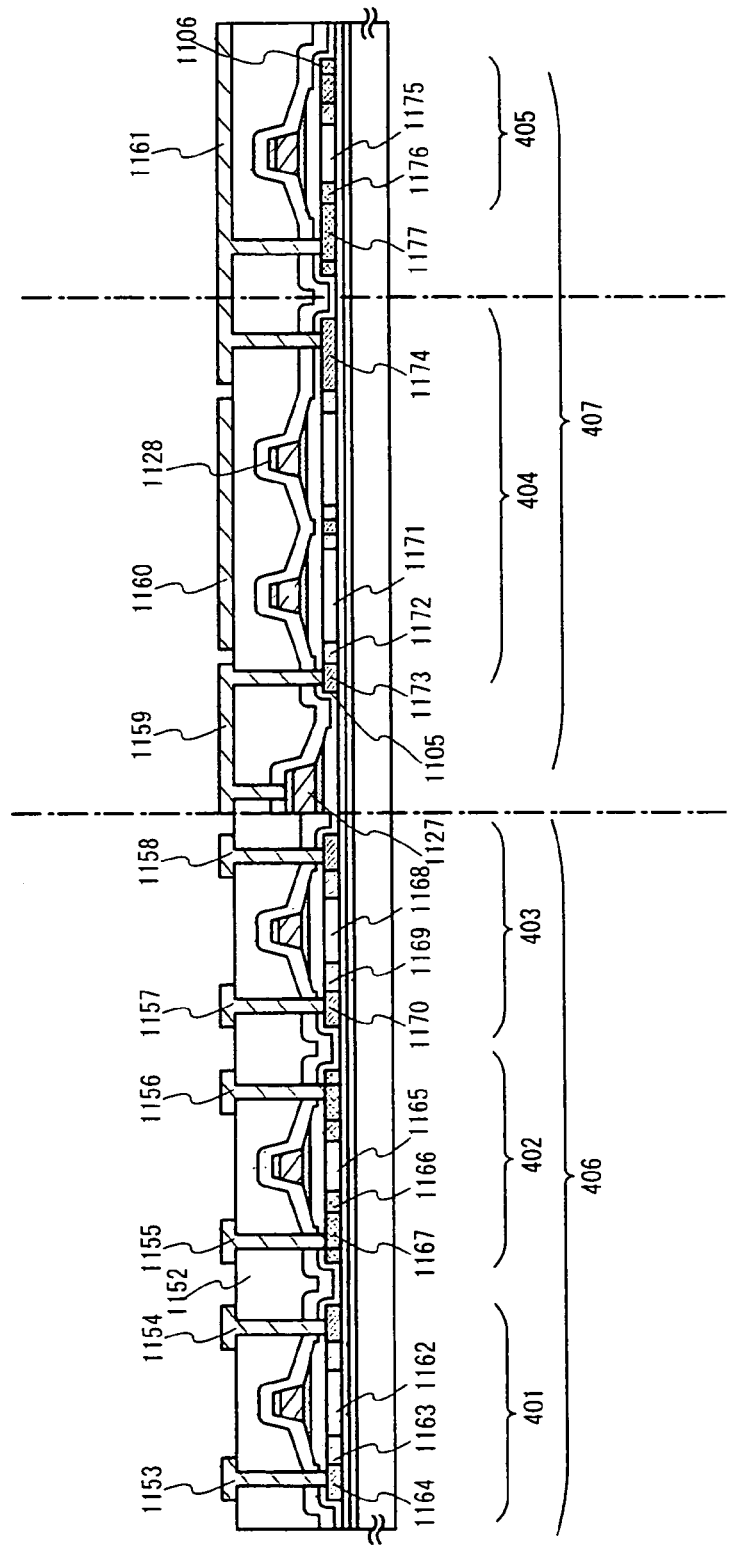
FIG. 6 is a diagram showing a manufacturing step of the AM-LCD.

After the active matrix substrate as illustrated in FIG. 6 is obtained in accordance with Embodiment 1, an oriented film is formed on the active matrix substrate of FIG. 6 and subjected to rubbing treatment. In this embodiment, before the oriented film is formed, an organic resin film such as an acrylic resin film is patterned to form columnar spacers in desired positions in order to keep the substrates apart. The columnar spacers may be replaced by spherical spacers sprayed onto the entire surface of the substrate. An opposite substrate is prepared next. The opposite substrate has a color filter in which colored layers and light-shielding layers are arranged with respect to the pixels. A light-shielding layer is also placed in the driving circuit portion. A planarization film is formed to cover the color filter and the light-shielding layer. On the planarization film, an opposite electrode is formed from a transparent conductive film in the pixel portion. An oriented film is formed over the entire surface of the opposite substrate and is subjected to rubbing treatment.

Then the opposite substrate is bonded to the active matrix substrate on which the pixel portion and the driving circuits are formed, using a sealing member (not shown). The sealing member has a filler mixed therein and the filler, together with the columnar spacers, keeps the distance between the two substrates while they are bonded. Thereafter a liquid crystal material is injected between the substrates and an encapsulant (not shown) is used to completely seal the substrates. A known liquid crystal material can be used. The active matrix liquid crystal display device is thus completed. If necessary, the active matrix substrate or the opposite substrate is cut into pieces of desired shapes. The display device may be appropriately provided with a polarizing plate using a known technique. Then FPCs are attached to the substrate using a known technique.

Figure 7:
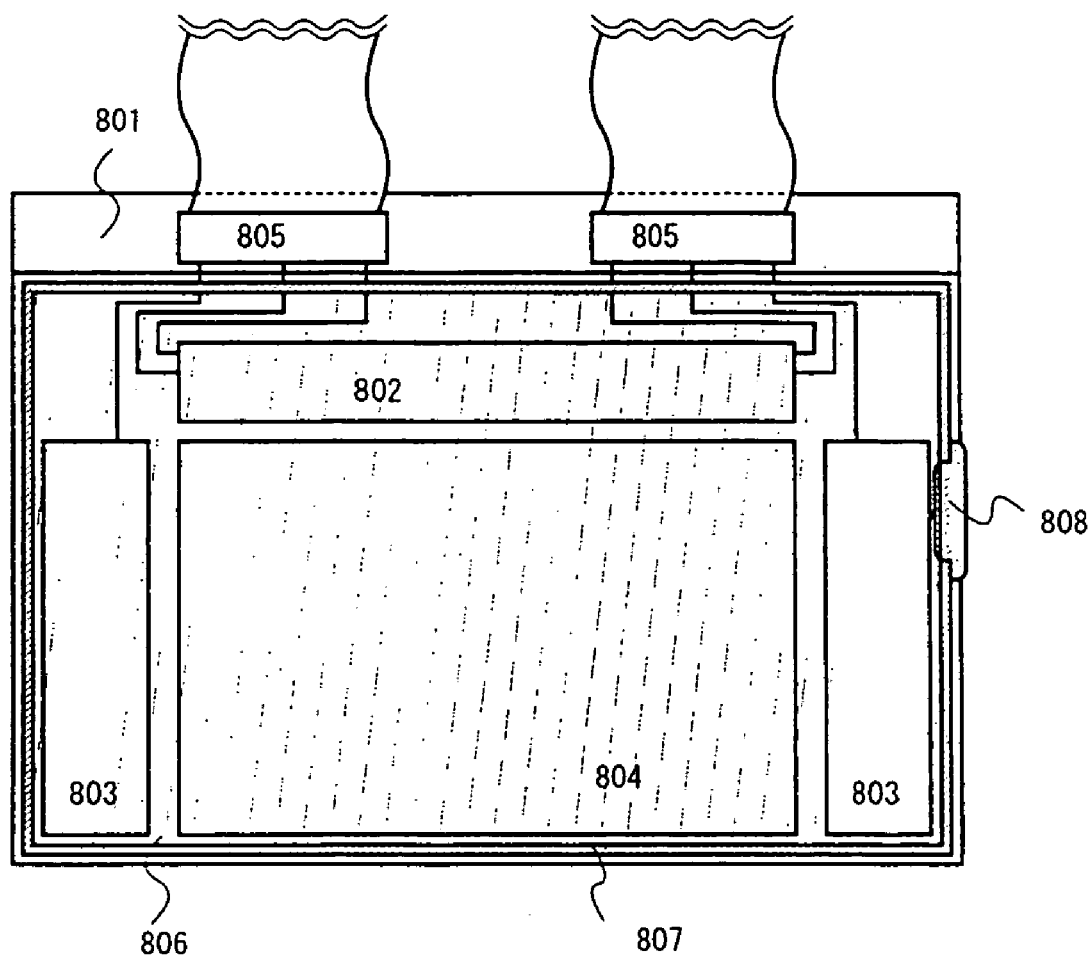
FIG. 7 is a top view showing an appearance of a liquid crystal module.

The structure of the thus obtained liquid crystal module is described with reference to the top view in FIG. 7.

A pixel portion 804 is placed in the center of an active matrix substrate 801. A source signal line driving circuit 802 for driving source signal lines is positioned above the pixel portion 804. Gate signal line driving circuits 803 for driving gate signal lines are placed to the left and right of the pixel portion 804. Although the gate signal line driving circuits 803 are symmetrical with respect to the pixel portion in this embodiment, the liquid crystal module may have only one gate signal line driving circuit on one side of the pixel portion. Of the above two options, a designer can choose the arrangement that suits better considering the substrate size or the like of the liquid crystal module. However, the symmetrical arrangement of the gate signal line driving circuits shown in FIG. 7 is preferred in terms of circuit operation reliability, driving efficiency, and the like.

Signals are inputted to the driving circuits from flexible printed circuits (FPC) 805. The FPCs 805 are press-fit through an anisotropic conductive film or the like after opening contact holes in the interlayer insulating film and resin film and forming a connection electrode 809 so as to reach the wiring lines arranged in given places of the substrate 801. The connection electrode is formed from ITO in this embodiment.

A sealing agent 807 is applied to the substrate along its perimeter surrounding the driving circuits and the pixel portion. An opposite substrate 806 is bonded to the substrate 801 by the sealing agent 807 while a spacer 810 formed in advance on the active matrix substrate keeps the distance between the two substrates constant. A liquid crystal element is injected through an area of the substrate that is not coated with the sealing agent 807. The substrates-are then sealed by an encapsulant 808. The liquid crystal module is completed through the above steps.

Although all of the driving circuits are formed on the substrate in the example shown here, several ICs may be used for some of the driving circuits.

[Embodiment 4]

Embodiment 1 shows an example of reflective display device in which a pixel electrode is formed from a reflective metal material. Shown in this embodiment is an example of transmissive display device in which a pixel electrode is formed from a light-transmitting conductive film.

The manufacture process up through the step of forming an interlayer insulating film is identical with the process of Embodiment 1, and the description thereof is omitted here. After the interlayer insulating film is formed in accordance with Embodiment 1, a pixel electrode 601 is formed from a light-transmitting conductive film. Examples of the light-transmitting conductive film include an ITO (indium tin oxide alloy) film, an indium oxide-zinc oxide alloy ($In_2O_3$—ZnO) film, a zinc oxide (ZnO) film, and the like.

Thereafter, contact holes are formed in an interlayer insulating film 600. A connection electrode 602 overlapping the pixel electrode is formed next. The connection electrode 602 is connected to a drain region through the contact hole. At the same time the connection electrode is formed, source electrodes or drain electrodes of other TFTs are formed.

Although all of the driving circuits are formed on the substrate in the example shown here, several ICs may be used for some of the driving circuits.

Figure 8:
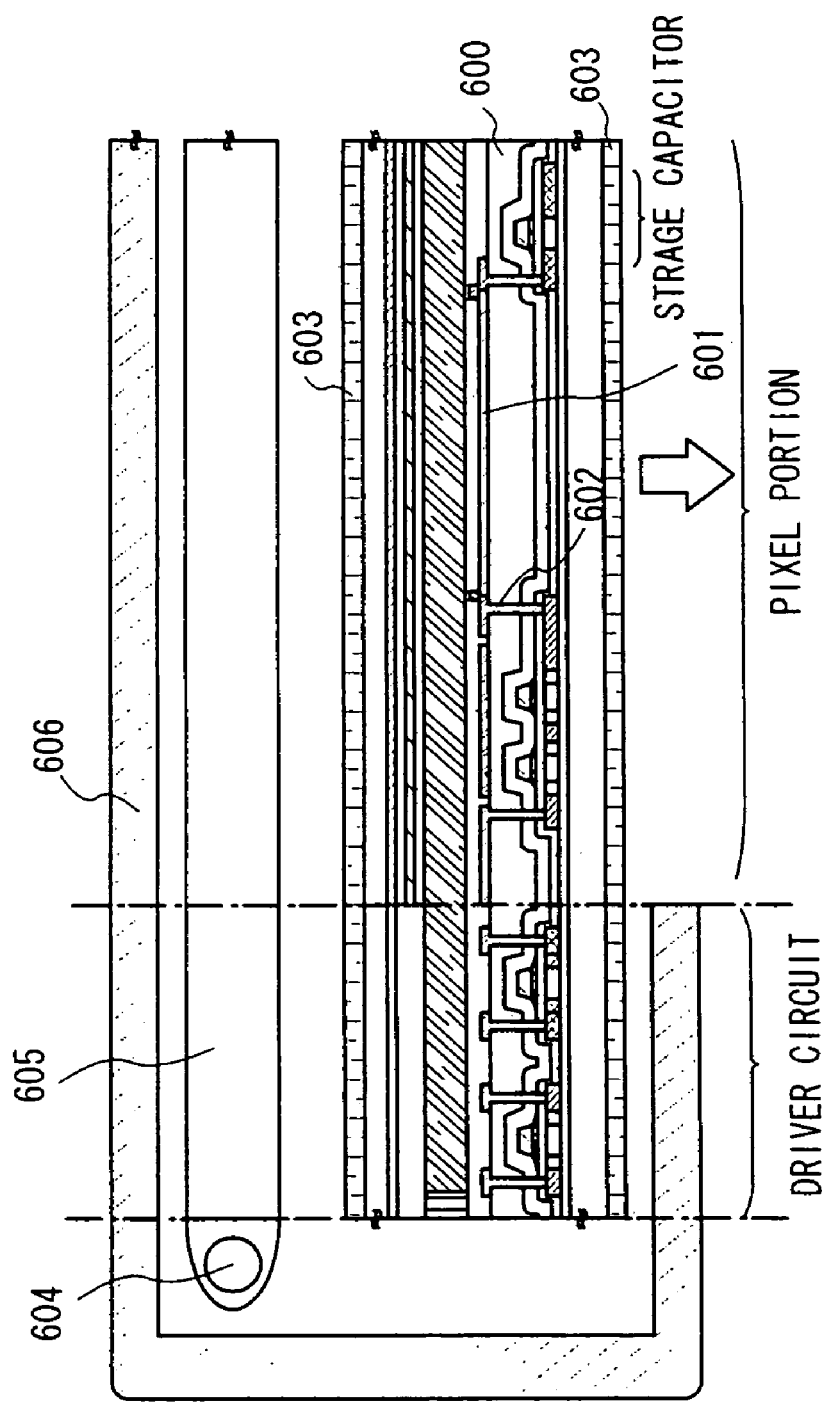
FIG. 8 is a cross sectional view of one example of a liquid crystal display device.

An active matrix substrate is completed as above. A liquid crystal module is manufactured from this active matrix substrate in accordance with Embodiment 3. The liquid crystal module is provided with a backlight 604 and a light guiding plate 605, and is covered with a cover 606 to complete the active matrix liquid crystal display device of which a partial sectional view is shown in FIG. 8. The cover is bonded to the liquid crystal module using an adhesive or an organic resin. When bonding the substrate to the opposite substrate, the substrates may be framed so that the space-between the frame and the substrates is filled with an organic resin for bonding. Since the display device is of transmissive type, the active matrix substrate and the opposite substrate each needs a polarizing plate 603 to be bonded.

[Embodiment 5]

Figure 9A:
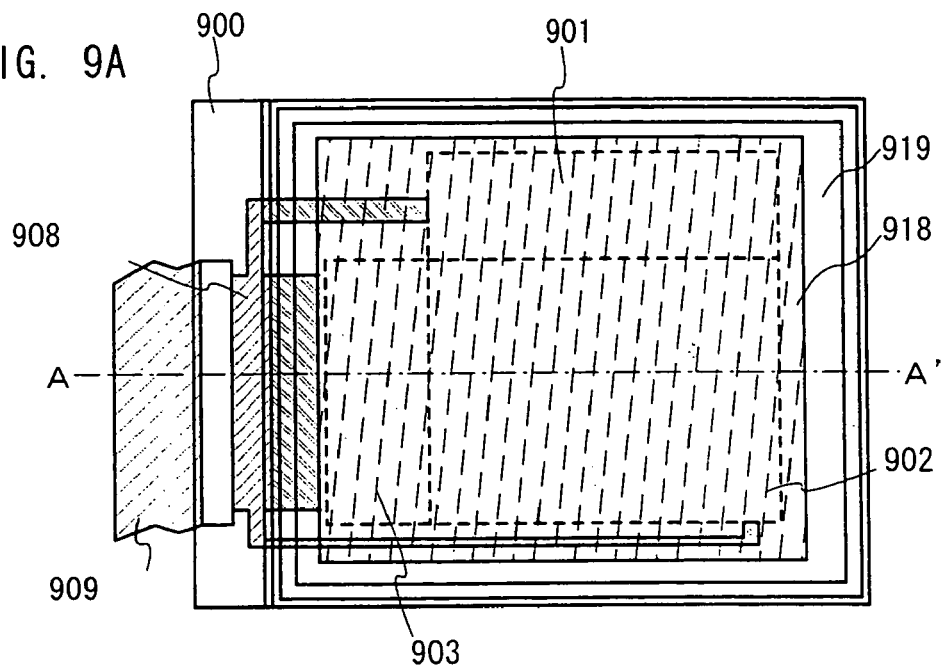
FIGS. 9A and 9B are a top view and a cross sectional view of an EL module.
Figure 9B:
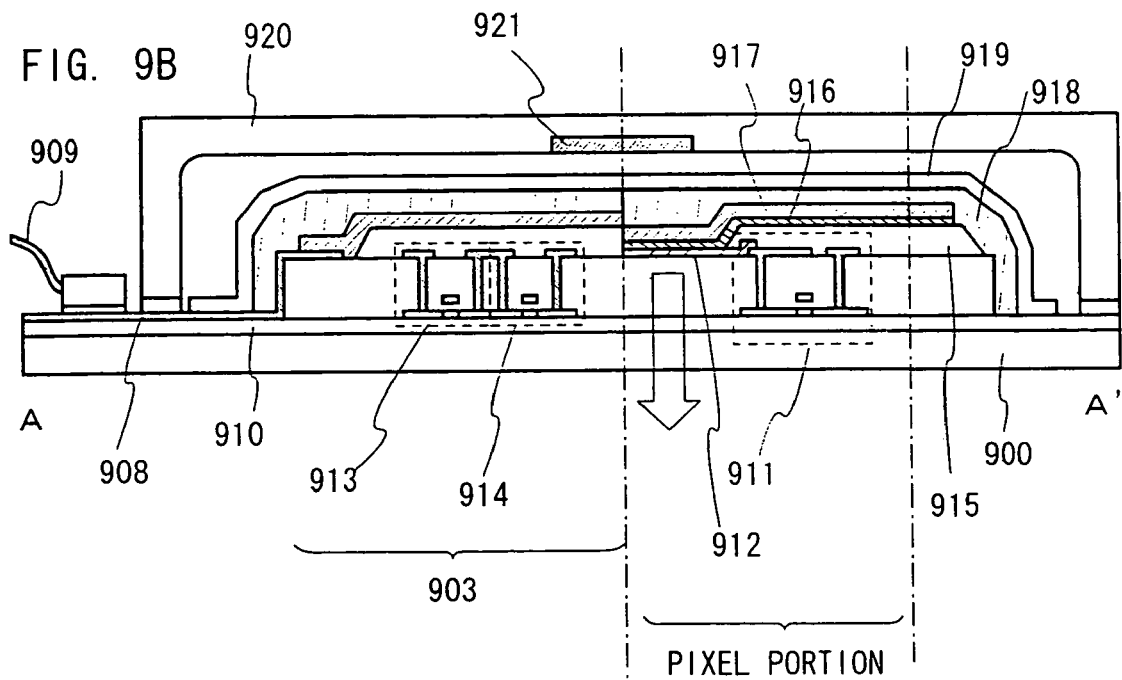

This embodiment describes with reference to FIGS. 9A and 9B an example of manufacturing a light emitting display that has an EL (electro luminescence) element. FIG. 9A is a top view of an EL module and FIG. 9B is a sectional view taken along the line A–A' of FIG. 9A. A pixel portion 902, a source side driving circuit 901, and a gate side driving circuit 903 are formed on a substrate 900 (for example, a glass substrate, a crystallized class substrate, or a plastic substrate) having an insulating surface. The pixel portion and the driving circuits are obtained in accordance with the above Embodiments. Denoted by 918 and 919 are a sealing member and a DLC film that serves as a protective film, respectively. The pixel portion and the driving circuits are covered with the sealing member 918, which is in turn covered with the protective film 919. The module is sealed by a cover member 920 using an adhesive. Desirably, the same material is used for the cover member 920 and the substrate 900 in order to avoid deformation by heat or external force. For example, a glass substrate is used for the cover member and is processed by sand blasting or the like to have a concave shape (3 to 10 mm in depth) shown in FIG. 9. It is desirable to further process the cover member to form a concave portion (50 to 200 mm in depth) for housing a drying agent 921. If the EL module is to be multifaceted, a $CO_2$ laser or the like is used to cut the module with ends flush after bonding the cover member to the substrate.

908 denotes a wiring line for transmitting signals to be inputted to the source side driving circuit 901 and the gate side driving circuit 903. The wiring line 908 receives video signals and clock signals from an FPC (flexible printed circuit) 909 that serves as an external input terminal. Although the FPC alone is shown in the drawing here, a printed wiring board (PWB) may be attached to the FPC.

The sectional structure of the light emitting device is described next with reference to FIG. 9B. An insulating film 910 is formed on the substrate 900. On the insulating film 910, the pixel portion 902 and the gate side driving circuits 903 are formed. The pixel portion 902 comprises a plurality of pixels each having a current controlling TFT 911 and a pixel electrode 912 that is electrically connected to a drain of the TFT 911. The gate side driving circuit 903 is formed from a CMOS circuit that has a combination of an n-channel TFT 913 and a p-channel TFT 914.

These TFTs (including 911, 913, and 914) are manufactured in accordance with the above Embodiments.

The pixel electrode 912 functions as an anode of a light emitting element (an EL element). Banks 915 are formed on both sides of the pixel electrode 912. An EL layer 916 is formed on the pixel electrode 912 and a cathode 917 of the light is emitting element is formed thereon.

The EL layer 916 is for light emission and for moving carriers to emit light, and has a combination of electric charge transporting layers and electric charge injection layers in addition to a light emitting layer. The EL layer 916 is formed from, for example, a low molecular weight organic EL material, or a high molecular weight organic EL material. The EL layer may be a thin film of a light emitting material that emits light (fluorescence) by singlet excitation (singlet compound) or a thin film of a light emitting material that emits light (phosphorescence) by triplet excitation (triplet compound). The electric charge transporting layers and electric charge inject layers may be formed of inorganic materials such as silicon carbide. Known organic EL materials and inorganic materials can be used.

The cathode 917 also functions as a wiring line common to all the pixels, and is electrically connected to the FPC 909 through the connection wiring line 908. The elements included in the pixel portion 902 and in the gate side driving circuit 903 are all covered with the cathode 917, the sealing member 918, and the protective film 919.

A material transparent or translucent to visible light is preferably used for the sealing member 918. The material for the sealing member 918 is also preferred to allow as little moisture and oxygen as possible to transmit.

After the light emitting element is completely covered with the sealing member 918, the DLC film serving as the protective film 919 is formed at least on the surface (exposed surface) of the sealing member 918 as shown in FIG. 9B. Also, the protective film may be formed on the entire surface including a back side of the substrate. At this point, attention must be paid so as not to form the protective film in the area where the external input terminal (FPC) is to be provided. A mask may be employed to form the protective film avoiding the external input terminal area. Alternatively, a masking tape for use in a CVD apparatus may be used to cover the external input terminal area and avoid forming the protective film in the area.

With the above structure, the light emitting element is sealed by the sealing member 918 and the protective film to completely shut the light emitting element off of the outside. Moisture, oxygen, and other external substances that accelerate degradation of the EL layer due to an oxidation are thus prevented from entering the element. Therefore a highly reliable light emitting device can be obtained.

Figure 10:
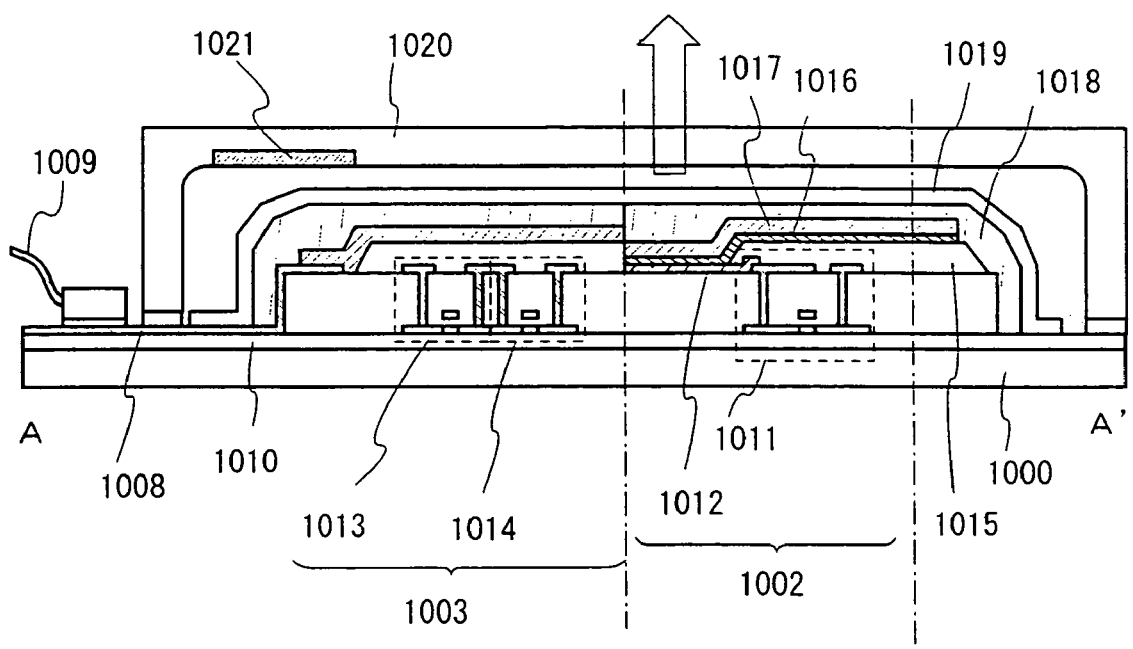
FIG. 10 is a cross sectional view of an EL module.

The anode (Pt, Cr, W and Ni) may serve as the pixel electrode and laminated film, in which the EL layer, the cathode with transmittance (thin metal to layer: AgMg and AlLi) and the transparent conductive film, may be layered on the anode. The light emitting device emits light in the direction reverse to the direction shown in FIG. 9. The cathode may serve as the pixel electrode and the EL layer and the anode may be layered on the cathode. Then the light emitting device emits light in the direction reverse to the direction shown in FIG. 9. FIG. 10 shows an example of this light emitting device. A top view of the device is identical with FIG. 9 and therefore is omitted.

The sectional structure shown in FIG. 10 is described below. A substrate 1000 may be a glass substrate or a quartz substrate. A semiconductor substrate or a metal substrate may also be used. An insulating film 1010 is formed on the substrate 1000. A pixel portion 1002 and a gate side driving circuit 1003 are formed on the insulating film 1010. The pixel portion 1002 comprises a plurality of pixels each having a current controlling TFT 1011 and a pixel electrode 1012 that is electrically connected to a drain of the TFT 1011. The gate side driving circuit 1003 is formed from a CMOS circuit that has a combination of an n-channel TFT 1013 and a p-channel TFT 1014.

The pixel electrode 1012 functions as a cathode of a light emitting element. Banks 1015 are formed on both sides of the pixel electrode 1012. An EL layer 1016 is formed on the pixel electrode 1012 and an anode 1017 of the light emitting element is formed thereon.

The anode 1017 also functions as a wiring line common to all the pixels, and is electrically connected to an FPC 1009 through a connection wiring line 1008. The elements included in the pixel portion 1002 and in the gate side driving circuit 1003 are all covered with the anode 1017, a sealing member 1018, and a protective film 1049 that is formed of DLC or the like. A cover member 1020 is bonded to the substrate 1000 using an adhesive. The cover member has a concave portion for housing a drying agent 1021.

A material transparent or translucent to visible light is preferably used for the sealing member 1018. The material for the sealing member 1018 is also preferred to allow as little moisture and oxygen as possible to transmit.

In FIG. 10, the pixel electrode serves as the cathode and the EL layer and the anode are layered thereon. Therefore light is emitted in the direction indicated by the arrow in FIG. 10.

This embodiment may be combined with Embodiment 1, Embodiment Mode 1 or Embodiment Mode 2.

[Embodiment 6]

The driving circuit portion and the pixel portion fabricated by implementing the present invention can be utilized for various modules (active matrix liquid crystal module, active matrix EL module and active matrix EC module). Namely, all of the electronic apparatuses are completed by implementing the present invention.

Following can be given as such electronic apparatuses: video cameras; digital cameras; head mounted displays (goggle type displays); car navigation systems; projectors; car stereo; personal computers; portable information terminals (mobile computers, mobile phones or electronic books etc.) etc. Examples of these are shown in FIGS. 11A–11F, 12A–12D and 13A–13C.

Figure 11A:
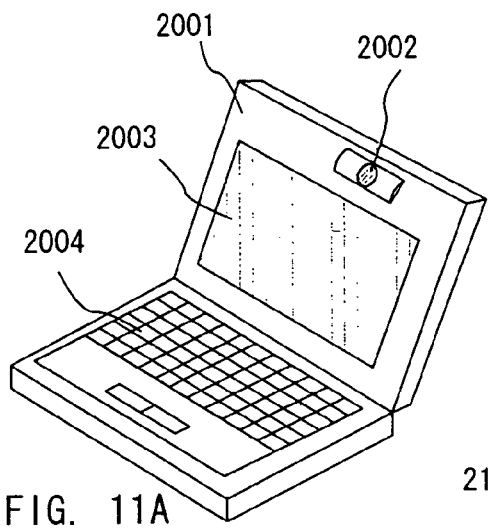
FIGS. 11A to 11F are diagrams showing examples of electronic devices.

FIG. 11A is a personal computer which comprises: a main body 2001; an image input section 2002; a display section 2003; and a keyboard 2004. The present invention be applied to the display section 2003.

Figure 11B:
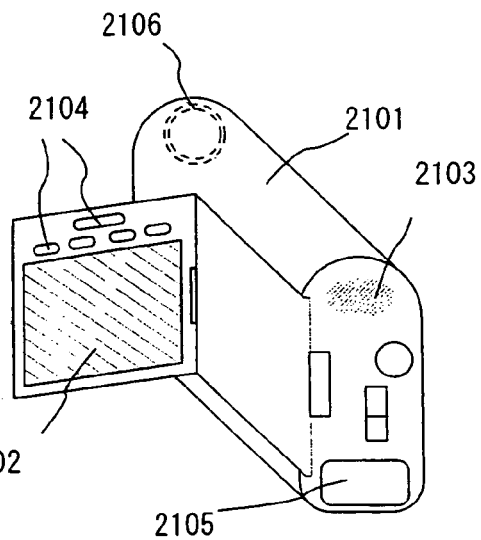

FIG. 11B is a video camera which comprises: a main body 2101; a display section 2102; a voice input section 2103; operation switches 2104; a battery 2105 and an image receiving section 2106. The present invention can be applied to the display section 2102.

Figure 11C:
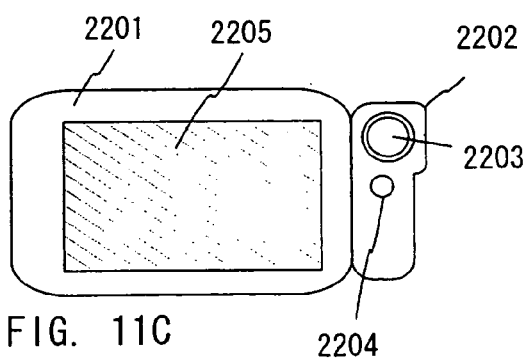

FIG. 11C is a mobile computer which comprises: a main body 2011; a camera section 2202; an image receiving section 2203; operation switches 2204 and a display section 2205. The present invention can be applied to the display section 2205.

Figure 11D:
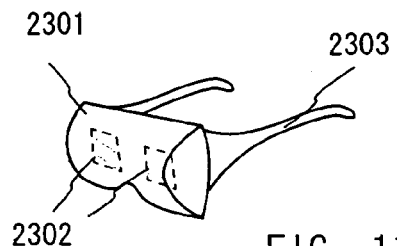

FIG. 11D is a goggle type display which comprises: a main body 2301; a display section 2302; and an arm section 2303. The present invention can be applied to the display section 2302.

Figure 11E:
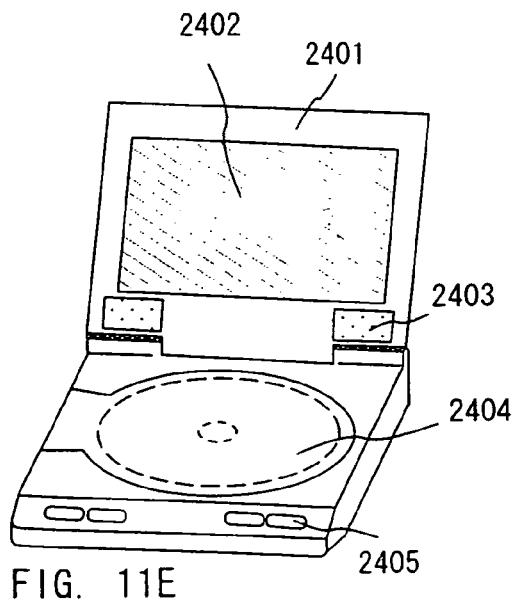

FIG. 11E is a player using a recording medium which records a program (hereinafter referred to as a recording medium) which comprises: a main body 2401; a display section 2402; a speaker section 2403; a recording medium 2404; and operation switches 2405. This apparatus uses DVD (digital versatile disc), CD, etc. for the recording medium, and can perform music appreciation, film appreciation, games and use for Internet. The present invention can be applied to the display section 2402.

Figure 11F:
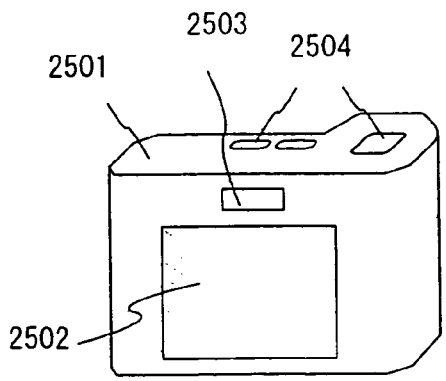

FIG. 11F is a digital camera which comprises: a main body 2501; a display section 2502; a view finder 2503; operation switches 2504; and an image receiving section (not shown in the figure). The present invention can be applied to the display section 2502.

Figure 12A:
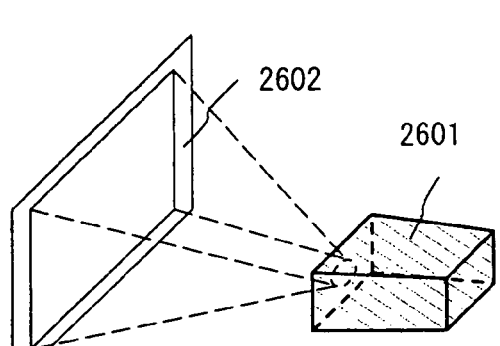
FIGS. 12A to 12D are diagrams showing examples of electronic devices.

FIG. 12A is a front type projector which comprises: a projection system 2601; and a screen 2602. The present invention can be applied to the liquid crystal module 2808 which forms a part of the projection system 2601 to complete the whole system.

Figure 12B:
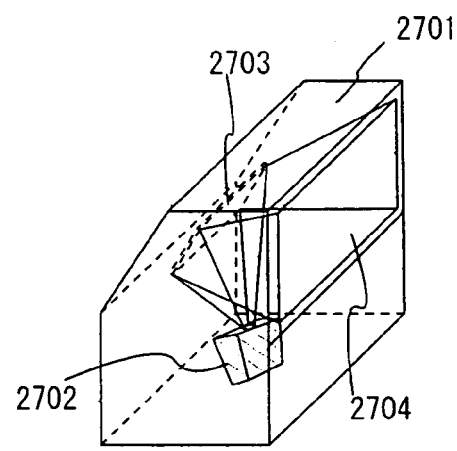

FIG. 12B is a rear type projector which comprises: a main body 2701; a projection system 2702; a mirror 2703; and a screen 2704. The present invention can be applied to the liquid crystal module 2808 which forms a part of the projection system 2702 to complete the whole system.

Figure 12C:
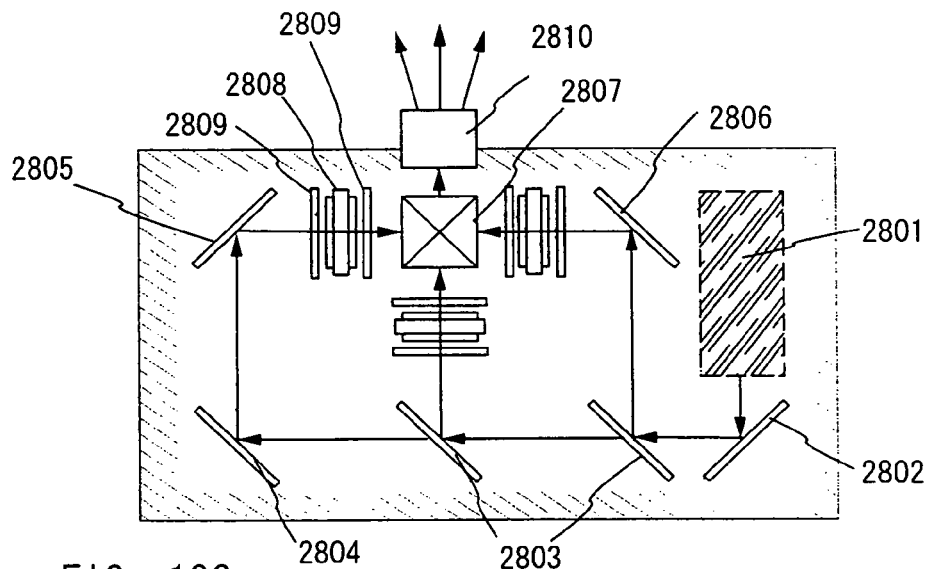

FIG. 12C is a diagram which shows an example of the structure of a projection system 2601 and 2702 in FIGS. 12A and 12B, respectively. Each of projection systems 2601 and 2702 comprises: an optical light source system 2801; mirrors 2802 and 2804 to 2806; a dichroic mirror 2803; a prism 2807; a liquid crystal module 2808; a phase differentiating plate 2809; and a projection optical system 2810. The projection optical system 2810 comprises an optical system having a projection lens. Though this embodiment shows an example of 3-plate types this is not to limit to this embodiment and a single plate type may be used for instance. Further, an operator may appropriately dispose an optical lens, a film which has a function to polarize light, a film which adjusts a phase difference or an IR film, etc. in the optical path shown by an arrow in FIG. 12C.

Figure 12D:
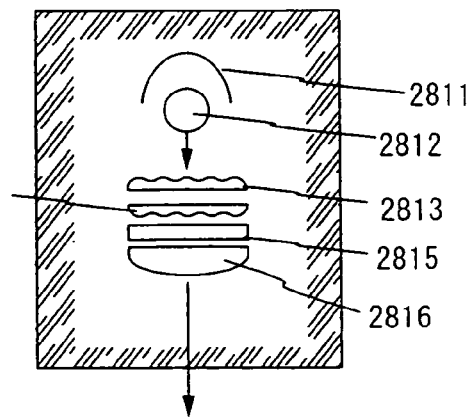

FIG. 12D is a diagram showing an example of a structure of an optical light source system 2801 in FIG. 12C. In this embodiment, the optical light source system 2801 comprises: a reflector 2811; a light source 2812; lens arrays 2813 and 2814; a polarizer conversion element 2815; and a collimator lens 2816. Note that the optical light source system shown in FIG. 12D is merely an example and the structure is not limited to this example. For instance, an operator may appropriately dispose an optical lens, a film which has a function to polarize light, a film which adjusts a phase difference or an IR film, etc.

Note that the projectors shown FIGS. 12A–12D are the cases of using a transmission type electro-optical device, and applicable examples of a reflection type electro-optical device and an EL module are not shown.

Figure 13A:
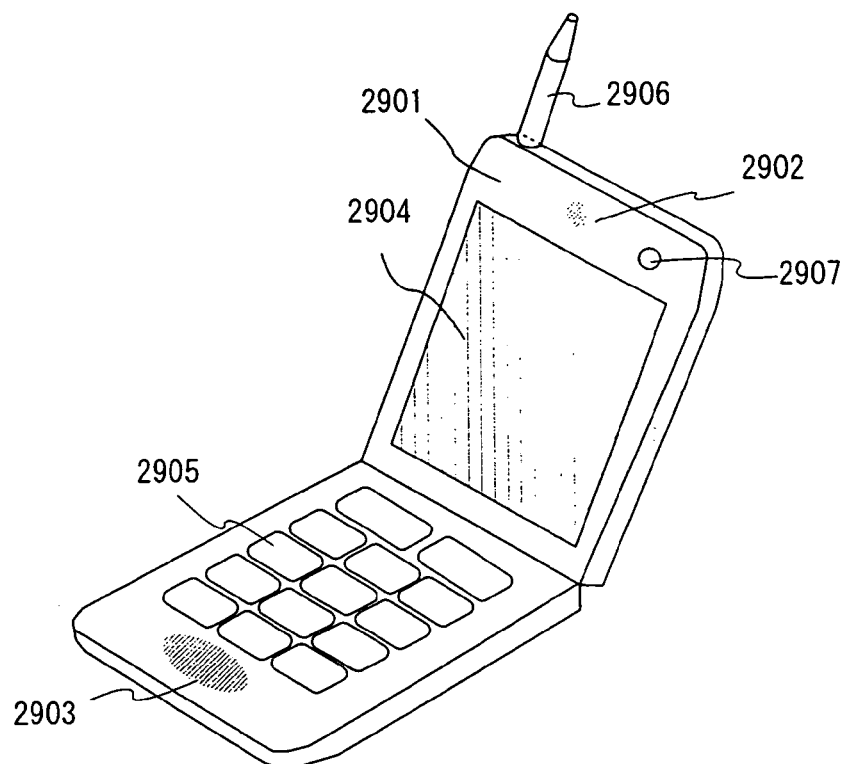
FIGS. 13A to 13C are diagrams showing examples of electronic devices.

FIG. 13A is a mobile phone which comprises: a main body 2901; a voice output section 2902; a voice input section 2903; a display section 2904; operation switches 2905; an antenna 2906; and an image input section (CCD, image sensor, etc.) 2907 etc. The present invention can be applied to the display section 2904.

Figure 13B:
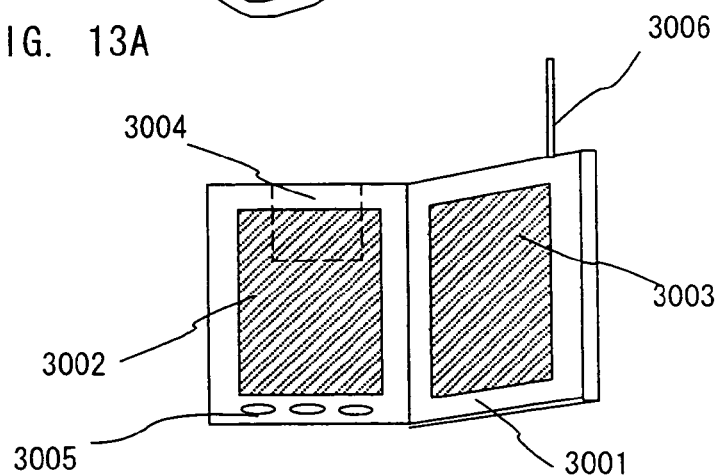

FIG. 13B is a portable book (electronic book) which comprises: a main body 3001; display sections 3002 and 3003; a recording medium 3004; operation switches 3005 and an antenna 3006 etc. The present invention can be applied to the display sections 3002 and 3003.

Figure 13C:
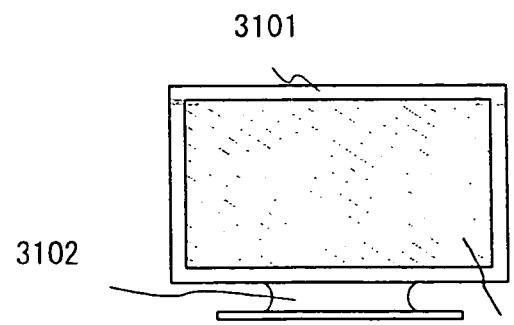
Figure 14:
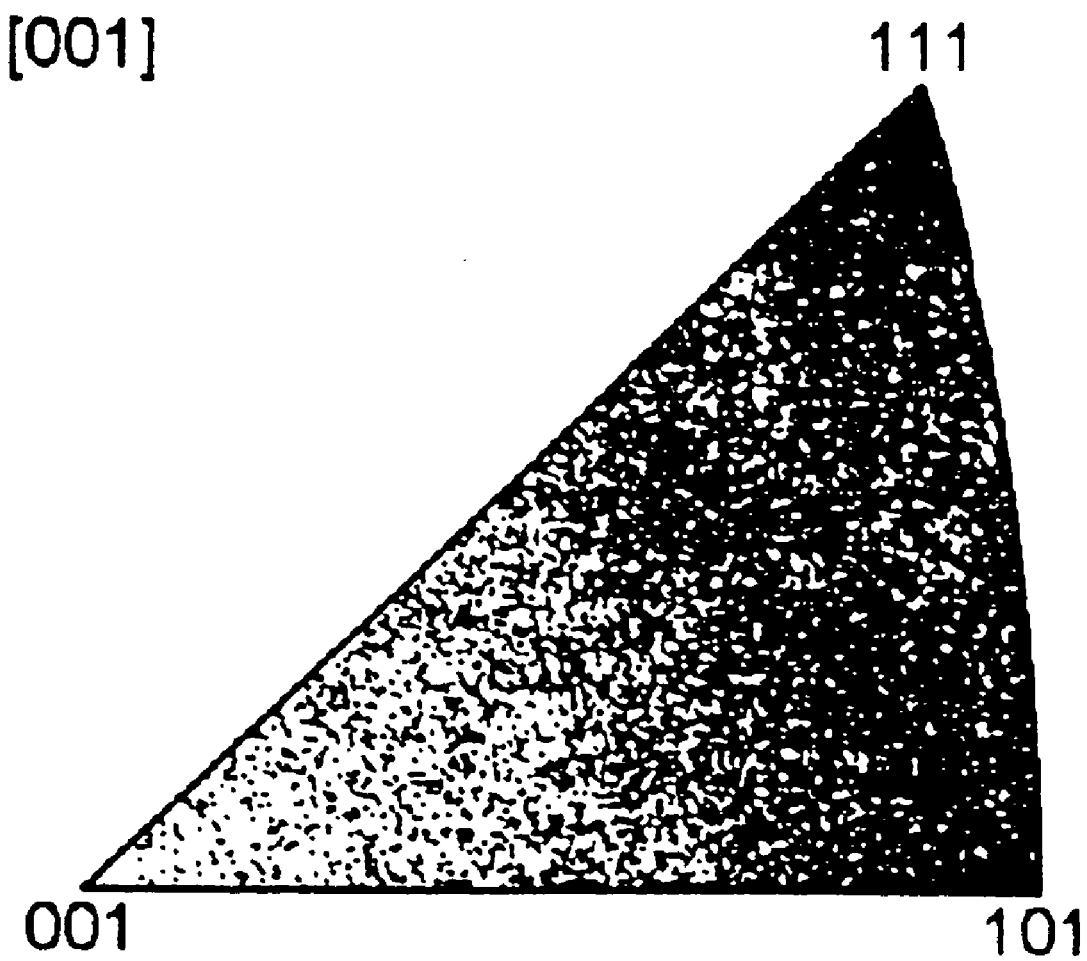
FIG. 14 is an inverse pole figure of a silicon film (including argon) having a crystalline structure according to the present invention, which is obtained from an EBSP method.

FIG. 13C is a display which comprises: a main body 3101; a supporting section 3102; and a display section 3103 etc. The present invention can be applied to the display section 3103.

In addition, the display shown in FIG. 13C is small and medium type of large type, for example, screen of the display sized 5 to 20 inches. Moreover, it is it preferable to mass-produce by executing a multiple pattern using a substrate sized 1×1 m to form a such sized display section.

As described above, the applicable range of the present invention is very large, and the invention can be applied to electronic apparatuses of various areas. Note that the electronic devices of this embodiment can be achieved by utilizing any combination of constitutions in Embodiments 1 to 5.

According to the present invention, an orientation ratio of the film can be increased and a distortion present in the film after the crystallization can be suppressed as compared with that present in the film before the crystallization.

What is claimed is:

1. A method of manufacturing a semiconductor device, comprising the steps of:
    forming on an insulating surface a semiconductor film having an amorphous structure;
    adding a first noble gas element to the semiconductor film having the amorphous structure;
    adding a metallic element to the semiconductor film having the amorphous structure;
    crystallizing the semiconductor film to form the semiconductor film having a crystalline structure;
    selectively adding a second noble gas element to the semiconductor film having the crystalline structure to form a region including the second noble gas element;
    irradiating a light to getter the metallic element to the region including the second noble gas element to selectively reduce the metallic element in the semiconductor film having the crystalline structure; and
    removing the region including the second noble gas element.

2. The method according to claim 1, wherein the light is emitted from one selected from the group consisting of a halogen lamp, a metal halide lamp, a xenon arc lamp, a carbon arc lamp, a high pressure sodium lamp, and a high pressure mercury lamp.

3. The method according to claim 1, wherein the metallic element is one selected from the group consisting of Fe, Ni, Co, Ru, Rh, Pd, Os, Ir, Pt, Cu, and Au.

4. The method according to claim 1, wherein each of the first noble gas element and second noble gas element is one selected from the group consisting of He, Ne, Ar, Kr, and Xe.

5. A method of manufacturing a semiconductor device, comprising the steps of:
    forming on an insulating surface a semiconductor film having an amorphous structure;
    adding a first noble gas element to the semiconductor film having an amorphous structure;
    adding a metallic element to the semiconductor film having the amorphous structure;
    crystallizing the semiconductor film to form the semiconductor film having a crystalline structure;
    selectively adding a second noble gas element to the semiconductor film having the crystalline structure to form a region including the second noble gas element;
    heating and irradiating a light to getter the metallic element to the region including the second noble gas element to selectively reduce the metallic element in the semiconductor film having the crystalline structure; and
    removing the region including the second noble gas element.

6. The method according to claim 5, wherein the light is emitted from one selected from the group consisting of a halogen lamp, a metal halide lamp, a xenon arc lamp, a carbon arc lamp, a high pressure sodium lamp, and a high pressure mercury lamp.

7. The method according to claim 5, wherein the metallic element is one selected from the group consisting of Fe, Ni, Co, Ru, Rh, Pd, Os, Ir, Pt, Cu, and Au.

8. The method according to claim 5, wherein each of the first noble gas element and second noble gas element is one selected from the group consisting of He, Ne, Ar, Kr, and Xe.

9. A method of manufacturing a semiconductor device, comprising the steps of:
    forming on an insulating surface a semiconductor film which includes a first noble gas element and having an amorphous structure;
    adding a metallic element to the semiconductor film having the amorphous structure;
    crystallizing the semiconductor film to form the semiconductor film having a crystalline structure;
    selectively adding a second noble gas element to the semiconductor film having the crystalline structure to form a region including the second noble gas element;
    irradiating a light to getter the metallic element to the region including the noble gas element to selectively reduce the metallic element in the semiconductor film having the crystalline structure; and
    removing the region including the second noble gas element.

10. The method according to claim 9, wherein the light is emitted from one selected from the group consisting of a halogen lamp, a metal halide lamp, a xenon arc lamp, a carbon arc lamp, a high pressure sodium lamp, and a high pressure mercury lamp.

11. The method according to claim 9, wherein the metallic element is one selected from the group consisting of Fe, Ni, Co, Ru, Rh, Pd, Os, U, Pt, Cu, and Au.

12. The method according to claim 9, wherein each of the first noble gas element and second noble gas element is one selected from the group consisting of He, Ne, Ar, Kr, and Xe.

13. A method of manufacturing a semiconductor device, comprising the steps of:
    forming on an insulating surface a semiconductor film which includes a first noble gas element and having an amorphous structure;
    adding a metallic element to the semiconductor film having the amorphous structure;
    crystallizing the semiconductor film to form the semiconductor film having a crystalline structure;
    selectively adding a second noble gas element to the semiconductor film having the crystalline structure to form a region including the second noble gas element;
    heating and irradiating a light to getter the metallic element to the region including the second noble gas element to selectively reduce the metallic element in the semiconductor film having the crystalline structure; and
    removing the region including the second noble gas element.

14. The method according to claim 13, wherein the light is emitted from one selected from the group consisting of a halogen lamp, a metal halide lamp, a xenon arc lamp, a carbon arc lamp, a high pressure sodium lamp, and a high pressure mercury lamp.

15. The method according to claim 13, wherein the metallic element is one selected from the group consisting of Fe, Ni, Co, Ru, Rh, Pd, Os, U, Pt, Cu, and Au.

16. The method according to claim 13, wherein each of the first noble gas element and second noble gas element is one selected from the group consisting of He, Ne, Ar, Kr, and Xe.

* * * * *